(12) United States Patent
Ohshima

(10) Patent No.: US 6,320,694 B1
(45) Date of Patent: *Nov. 20, 2001

(54) OPTICAL AMPLIFIER FOR USE IN OPTICAL COMMUNICATIONS EQUIPMENT

(75) Inventor: Chihiro Ohshima, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,790

(22) Filed: Mar. 17, 1998

(30) Foreign Application Priority Data

Oct. 17, 1997 (JP) .................................................. 9-285905

(51) Int. Cl.⁷ .................................................. H01S 3/00

(52) U.S. Cl. ...................................... 359/341.33; 359/345

(58) Field of Search .................................. 359/341, 345, 359/341.33

(56) References Cited

U.S. PATENT DOCUMENTS

| | | |
|---|---|---|
| 5,241,414 | 8/1993 | Giles et al. . |
| 5,646,775 * | 7/1997 | Delrosso et al. ..................... 359/341 |
| 5,801,877 * | 9/1998 | Yoneyama ..................... 359/341 |
| 5,835,259 * | 11/1998 | Kakui et al. ..................... 359/341 |
| 5,917,648 * | 6/1999 | Harker ..................... 359/341 |

FOREIGN PATENT DOCUMENTS

| | | |
|---|---|---|
| 0 722 232 A1 | 7/1996 | (EP) . |
| 0762569A2 | 3/1997 | (EP) . |
| 6-177837 | 6/1994 | (JP) . |
| 8-88430 | 4/1996 | (JP) . |
| 8-304860 | 11/1996 | (JP) . |
| 9-200130 | 7/1997 | (JP) . |

OTHER PUBLICATIONS

Fukushima, et al., "Magnetooptical Variable Optical Attenuator (1)", Proceedings of the 1996 Electronics Society Conference of IEICE, Aug. 30, 1996.

Suzuki, et al., "Magnetooptical Variable Optical Attentuator (1)", Proceedings of the 1996 Electronics Socieltly Conference of IEICE, Aug. 30, 1996.

* cited by examiner

*Primary Examiner*—Mark Hellner
(74) *Attorney, Agent, or Firm*—Staas & Halsey LLP

(57) ABSTRACT

The output level of pumping light supplied from a pumping light source is varied using a variable attenuator, which is controlled by a variable attenuator driver circuit. By separating a portion containing the pumping light source from a portion containing an amplification medium, it becomes possible to prevent heat emitted by the pumping light source from adversely affecting the amplification medium. By arranging the portion containing the pumping light source such that a pumping light source or sources can be added when necessary, optical transmission system requirements of having more pumping light sources for system upgrade can be accommodated readily. By packaging portions containing amplification media, an optical amplifier can be made small.

20 Claims, 23 Drawing Sheets

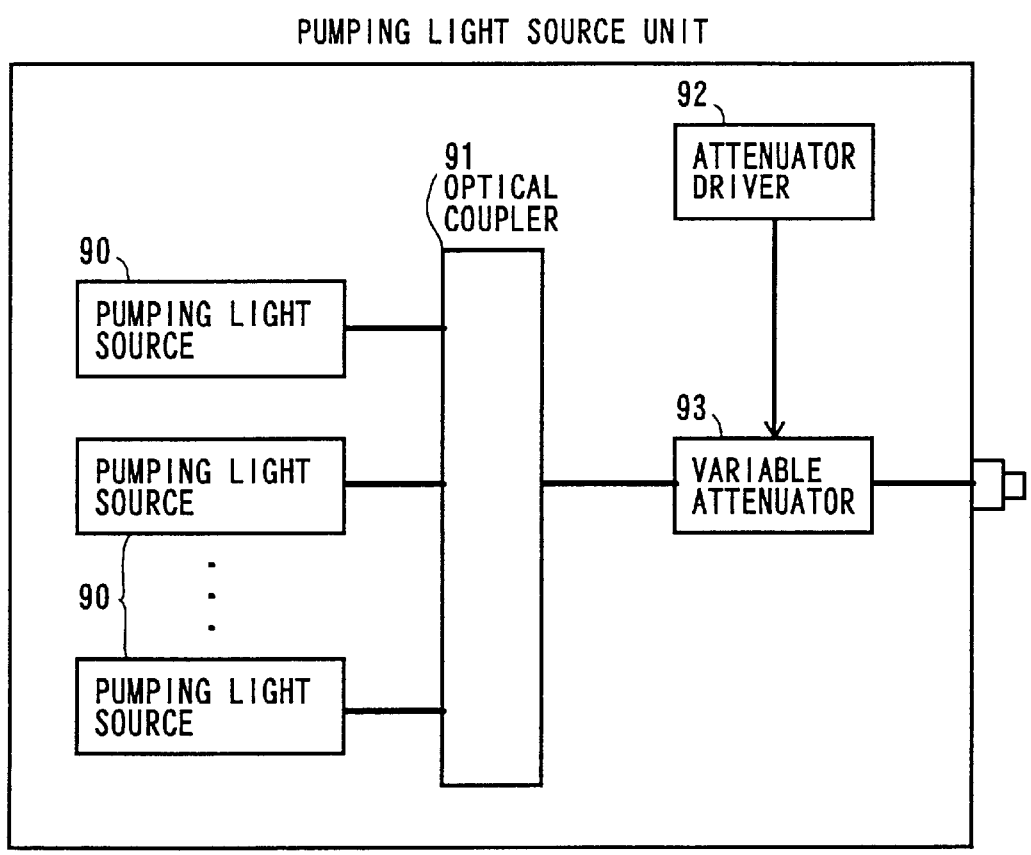
F I G. 7

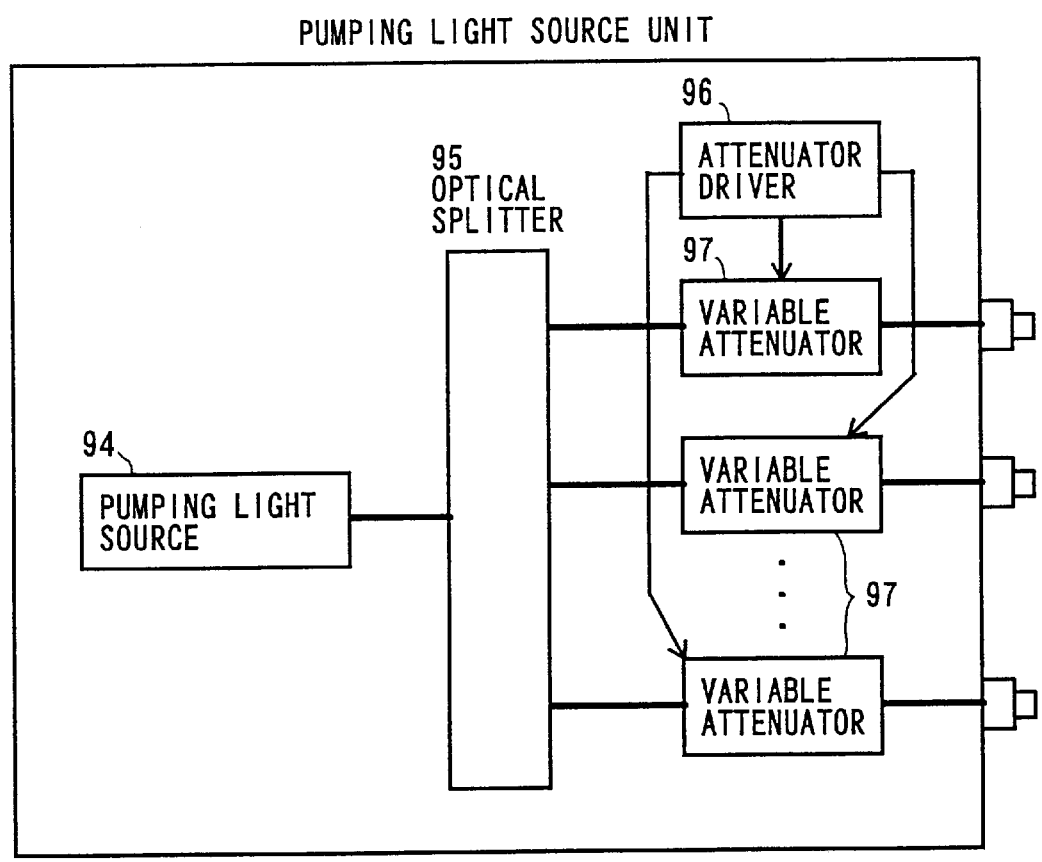
F I G. 8

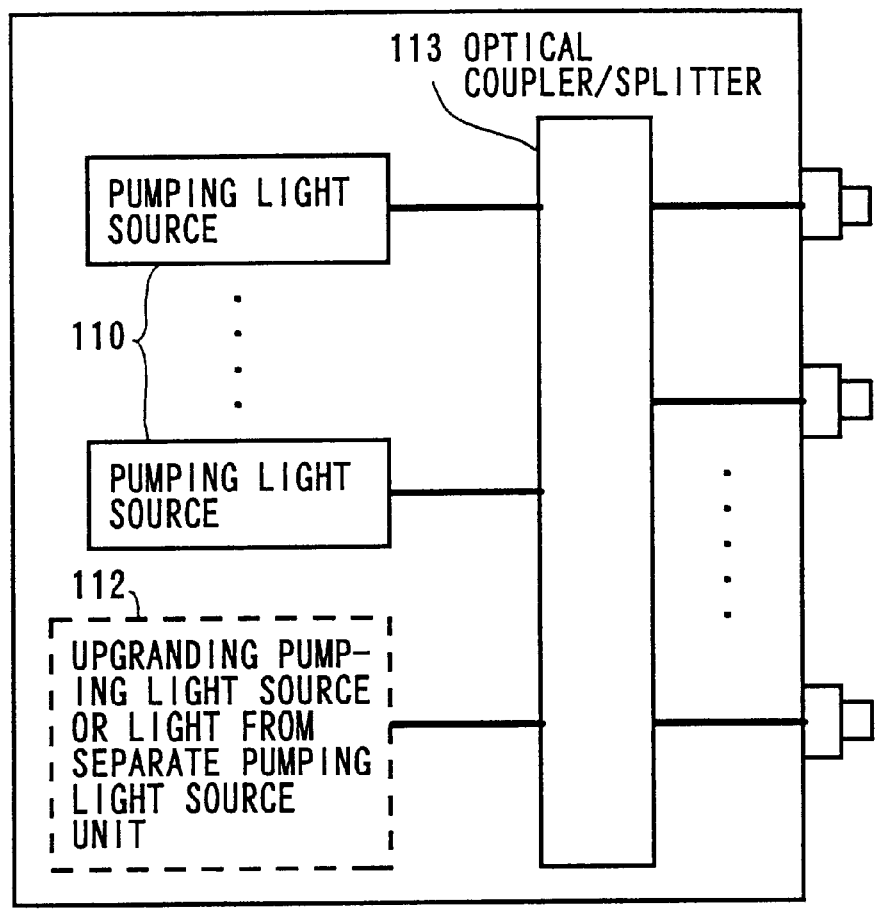
F I G. 1 1

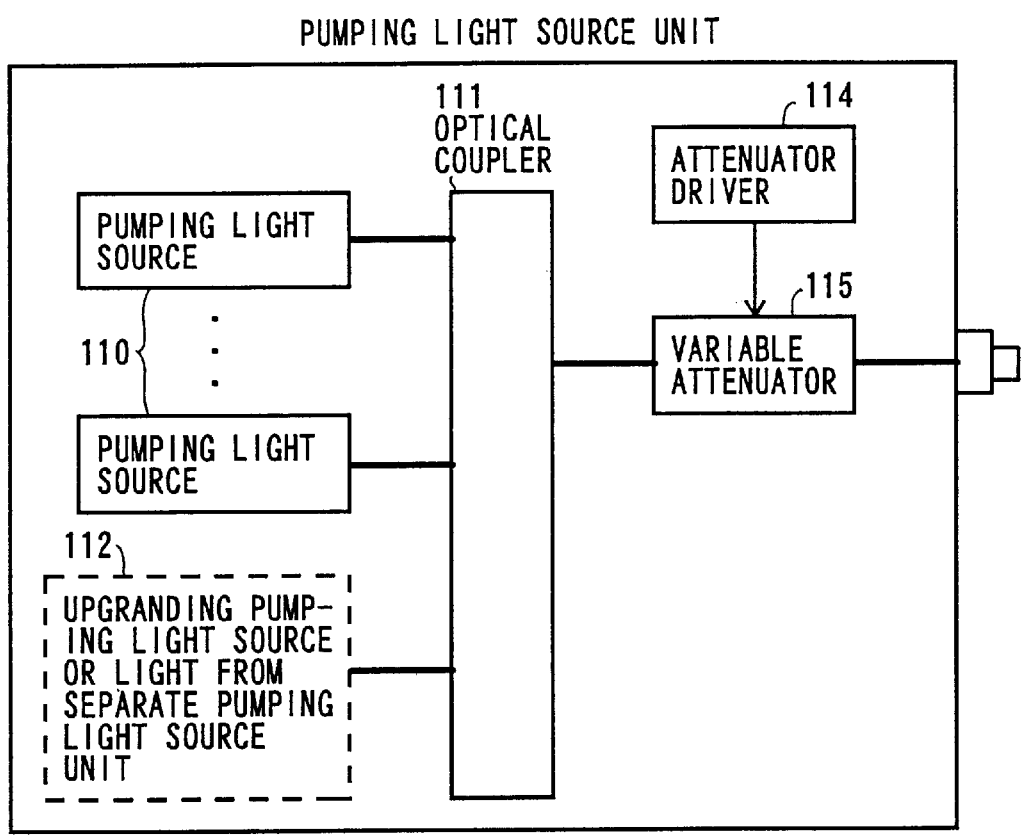
F I G. 1 2

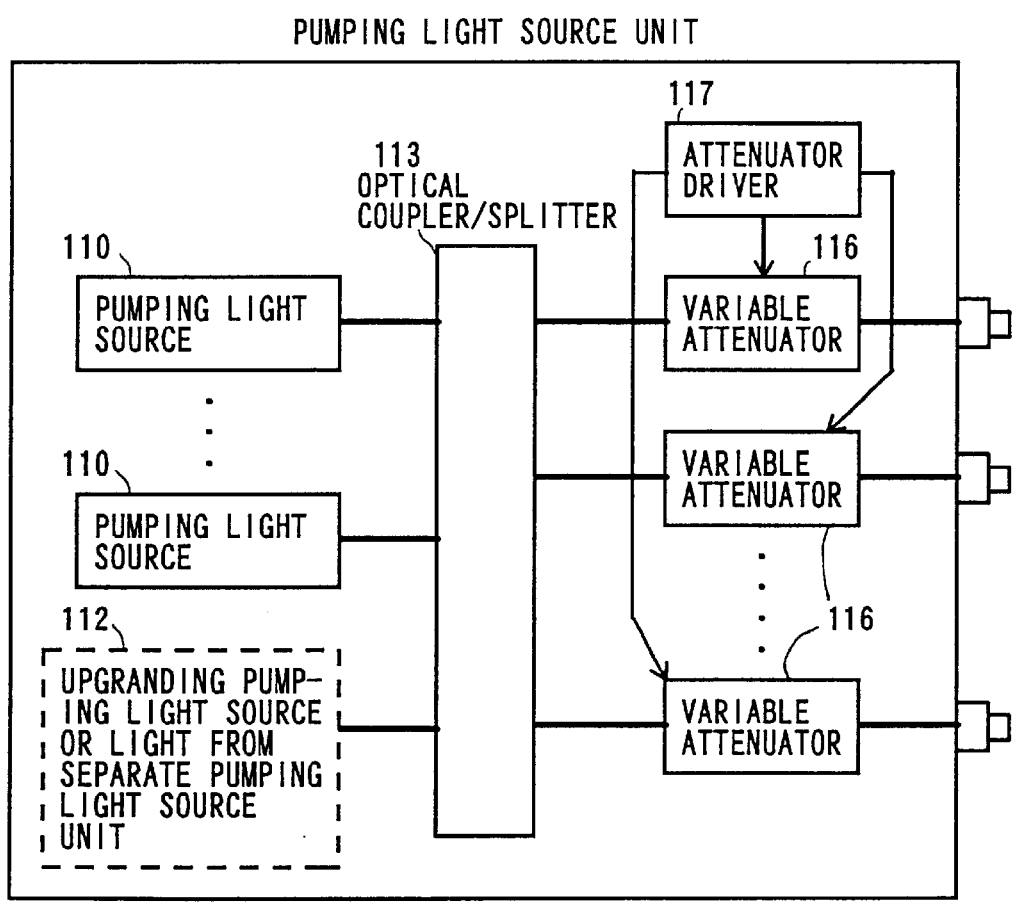
F I G. 1 3

OPTICAL AMPLIFIER FOR USE IN OPTICAL COMMUNICATIONS EQUIPMENT

BACKGROUND OF THE INVENTION

1. Field of the Invention

The present invention relates to an optical amplifier for use in optical communications equipment.

2. Description of the Related Art

In recent years, wavelength division multiplexing (WDM) transmission systems have been introduced. In transmitting stations, increasing the number of signal channels results in an increase in the number of post amplifiers used. An optical amplifier takes up a lot of space in optical transmitting equipment. It is therefore desired that the optical amplifier be decreased in size and produced in integrated form.

In the optical amplifier, a laser diode (LD) is used as a pumping light source and a component that gives off heat generated by the LD is associated with the light source. Of components that construct the optical amplifier, the light source and its associated radiator are very large, preventing the optical amplifier from becoming reduced in size. Thus, separating the pumping light source from the optical amplifier and grouping components necessary for use as a pumping light source, such as a light source and its associated driving circuit, as a pumping light source unit were thought of.

FIGS. 1A, 1B and 1C show arrangements of conventional pumping light source units.

As shown in FIGS. 1A, 1B and 1C, three types of pumping light source units may be considered (note that the example of FIG. 1A uses four pumping LDs). The example of FIG. 1C is used in the WDM system developed by CIENA (see catalog "CIENA Multiwave Line Amplifier Block Diagram").

In FIGS. 1A to 1C, 1 denotes a circuit for driving a pumping light source, 2, 3, 4, 5 and 8; pumping light sources, 6; a polarization beam splitter (PBS), 7; a wavelength division multiplexing (WDM) coupler, 9; an optical splitter for separating pumping light, and 10; an optical coupler/splitter for coupling and separating pumping light.

FIG. 1A, each of the four pumping light sources 2, 3, 4 and 5 is driven (for example, supplied with current) by a respective one of the four pumping light driving circuits 1 to produce light. The light from each of the pumping light sources 2 to 5 is output as linearly polarized light. The beams of light output from the pumping light sources 2 and 3 can be set substantially equal to each other in wavelength but will be differently polarized, The beams of light which are substantially equal to each other in wavelength but differently polarized are polarization-coupled by the polarization beam splitter 6. The pumping light sources 4 and 5 are of the same type as the pumping light sources 2 and 3 but will differ from the pumping light sources 2 and 3 in output wavelength. This indicates that, even if the pumping light sources 4 and 5 are of the same type as the pumping light sources 2 and 3, their wavelengths do not necessarily match because of variations in manufacturing process. The polarization-coupled pumping light from the pumping light sources 2 and 3 and the polarization-coupled pumping light from the pumping light sources 4 and 5 are coupled by the WDM coupler 7. The light output from the WDM coupler is sent to an optical amplification medium, for example, an erbium doped fiber (EDF), for use as pumping light for amplifying light signals. The WDM coupler is so named because it couples wavelength-multiplexed signal light and pumping light of a specific wavelength, but in practice it can be an ordinary optical coupler.

This arrangement is used when only one pumping light source cannot provide a sufficient amplification action to the optical amplification medium and intended to obtain pumping light with a larger power through the use of two or more pumping light sources.

The pumping light source unit of FIG. 1B comprises one pumping light source driver 1, one pumping light source 8, and an optical splitter 9 for separating pumping light from the pumping light source 8. This arrangement is used when the pumping light source has a power large enough to supply two or more optical amplification media (not shown). This arrangement allows the two or more optical amplification media to be operated equally with one pumping light source having a single wavelength and a single polarized wave.

The pumping light source unit of FIG. 1C comprises two or more pumping light source drivers 1, an equal number of pumping light sources 8, and an optical coupler/splitter 10 that couples and separates pumping beams of light from the pumping light sources. This arrangement is intended to supply two or more optical amplification media with pumping light from a single pumping light source unit, but it has two or more pumping light sources 8 to provide pumping light with higher power because a single pumping light source alone cannot give all of the optical amplifiers a sufficient amplifying action. As described above, however, there are variations in wavelength between two or more pumping light sources 8. Thus, the use of each of the pumping light sources 8 for a respective one of the optical amplification media will cause their respective amplification actions to vary. For this reason, this pumping light source unit is arranged such that beams of pumping light from the pumping light sources 8 are first coupled to produce a single beam of light and then the single beam of light is separated to thereby supply each of the optical amplification media with pumping light of the same property.

Hereinafter, what includes a pumping light source unit, an optical amplification medium or media, and other circuits including a control circuit shall be called an optical amplifier.

In an optical amplifier, automatic gain control (AGC) or automatic level control (ALC) is sometimes performed to control the supply amount of pumping light to an optical amplification medium. In conventional optical amplifiers, the amount of output light of a pumping light source is varied to vary the supply amount of pumping light to the optical amplification medium by changing a drive current to the pumping light source.

In the WDM transmission system, signal light beams of different wavelengths are collectively amplified by an optical amplifier. After the start of system implementation, the WDM transmission system is sometimes modified to increase the signal multiplexing degree (i.e., the system is upgraded). When the multiplexing degree is increased, the optical amplifier requires more pumping power in order to increase the supply amount of pumping light to the optical amplification media.

In the pumping light source units shown in FIGS. 1B and 1C, the ratio of the output power of each pumping light is fixed to the ratio of the splitting by the splitter 9 or the optical coupler/splitter 10, and the amount of pumping light at each output port cannot be varied arbitrarily.

The optical amplifier contains components that are associated with a pumping light source to radiate heat generated by it. These components are relatively large among components composing the optical amplifier, preventing the optical amplifier from becoming reduced in size. When LDs as pumping light sources that generate heat and driver circuits therefor are placed close together within the optical amplifier, it will create an excessive rise in temperature, reducing the performance and reliability of the optical amplifier.

Heretofore, even if the WDM transmission system is upgraded, pumping light can only be output up to the allowable maximum output of a pumping light source installed in an optical amplifier at the beginning of system implementation. As an example, assume that, in a 16-channel WDM transmission system, only four channels are employed at the beginning of system implementation. In this case, the optical amplifier used is naturally equipped with pumping light sources necessary to accommodate 16 channels, which increases the initial investment at the time of system installation.

In an optical communications device equipped with an optical amplifier of the built-in pumping light source type, heat generated in the device is difficult to radiate and it is therefore necessary to cool the device with a fan, dissipating extra power.

When pumping light of a narrow spectrum width emitted by an LD as a pumping light source reflects from optical parts composing an optical amplifier or a fiber junction back to the pumping LD, the operation of the LD becomes unstable, which makes the operation of the optical amplifier unstable. To avoid this problem, conventionally the optical amplifier has an optoisolater built in on the output side of the pumping LD. This arrangement requires more optical parts.

In the most used type of an optical amplifier, the amplification characteristic of an amplification medium is wavelength-dependent, and pumping LDs have variations in wavelength due to variations in the manufacturing process. For this reason, the optical amplifier has variations in amplification characteristic due to variations in wavelength.

In an optical amplifier in which a pumping light source unit and an optical amplification medium are coupled together by means of a connector, it is necessary to sound an alarm in the case that the connector has come off, because pumping light leaking out through the connector is very dangerous for persons at work.

SUMMARY OF THE INVENTION

It is an object of the present invention to provide an optical amplifier which has a function of changing the supply amount of pumping light to an amplification medium, and is small in size and little affected by heat generated by a pumping light source.

According to a first aspect of the present invention, there is provided an optical amplifier for amplifying incoming signal light in response to pumping light applied thereto, characterized by including a variable attenuator for varying the input level of the pumping light applied to the optical amplifier to thereby tune the amplification characteristic of the optical amplifier.

In the optical amplifier of the present invention, two or more optical amplification units that contain amplification media are assembled into one package.

The optical communications device of the present invention comprises a pumping light source unit having at least one pumping light source for generating pumping light and a unit for separating or coupling pumping light from the at least one pumping light source, and an optical amplification unit for amplifying incoming signal light in response to application thereto of pumping light from the pumping light source unit and is characterized in that the pumping light source unit is placed in a location in the optical communications device where heat radiation conditions are good.

According to a second aspect of the present invention, there is provided an optical amplifier for amplifying incoming signal light in response to application thereto of pumping light from a pumping light source unit having a pumping light source for generating a pumping light beam and an optical coupler unit for coupling multiple pumping light beams, characterized in that the pumping light source unit includes a polarization plane rotating unit for rotating the plane of polarization of output pumping light from the optical coupler unit through a first angle of rotation for transmission and rotating the plane of polarization of return light, resulting from the output pumping light being reflected from a connector connecting the pumping light source unit and other components of the optical amplifier back to the pumping light source unit, through a second angle of rotation, thereby inputting to the pumping light source return light, different in wavelength from the pumping light source generated by the pumping light source.

According to a third aspect of the present invention, there is provided an optical amplifier for amplifying incoming signal light in response to application thereto of pumping light from a pumping light source unit having multiple pumping light sources each generating a pumping light beam and an optical coupler/splitter unit for coupling multiple pumping light beams and splitting into individual light beams, characterized in that the pumping light source unit includes a polarization plane rotating unit for rotating the plane of polarization of output pumping light from the optical coupler unit through a first angle of rotation for transmission and rotating the plane of polarization of return light, resulting from the output pumping light being reflected from a connector connecting the pumping light source unit and other components of the optical amplifier together back to the pumping light source unit, through a second angle of rotation, thereby inputting to the pumping light source return light different in wavelength from the pumping light source generated by the pumping light source.

According to a fourth aspect of the present invention, there is provided an optical amplifier in which a pumping light source unit having a pumping light source for generating pumping light and an optical amplification unit having an amplification medium for amplifying incoming signal light in response to application of the pumping light thereto are connected together by means of a connector that allows the pumping light to be transmitted to the optical amplification unit, characterized in that the optical amplification unit includes a unit for determining whether or not the connection between the pumping light source unit and the optical amplification unit is established by means of the connector on the basis of the output level of the pumping light from the pumping light source unit.

According to a fifth aspect of the present invention, there is provided an optical amplifier in which a pumping light source unit having a pumping light source for generating pumping light and an optical amplification unit having an amplification medium for amplifying incoming signal light in response to application of the pumping light thereto are connected together by means of a connector that allows the pumping light to be transmitted to the optical amplification unit, characterized in that the pumping light source unit includes a unit for determining whether or not the connection between the pumping light source unit and the optical amplification unit is established by means of the connector on the basis of the level of return light reflected from the connector.

According to a sixth aspect of the present invention, there is provided an optical amplifier in which a pumping light source unit having a pumping light source for generating pumping light and an optical amplification unit having an amplification medium for amplifying incoming signal light in response to application of the pumping light thereto are connected together by means of a connector that allows the pumping light to be transmitted to the optical amplification unit, characterized by comprising a unit for determining whether or not the connection between the pumping light source unit and the optical amplification unit is established by means of the connector.

An optical amplification unit of the present invention has an amplification medium for amplifying incoming signal light in response to application thereto of pumping light from a separate pumping light source unit, the optical amplification unit and the pumping light source unit being connected by a connector to form an optical amplifier, and is characterized by the provision of a variable attenuator for adjusting the level of pumping light input to the amplification medium.

A pumping light source unit of the present invention has a pumping light source for generating pumping light to be output to a separate optical amplification unit, the pumping light source unit and the optical amplification unit being connected by a connector to form an optical amplifier, and is characterized by the provision of a variable attenuator for adjusting the level of pumping light to be output to the optical amplification unit.

According to the present invention, the pumping light, which, in the conventional system, has its output level maintained constant or adjusted by controlling the pumping light source itself, can be level-adjusted easily by the use of the variable attenuator, which allows pumping light with a suitable intensity to be supplied to the amplification medium.

In addition, since the pumping light source is separated from the optical amplification unit, two or more optical amplification units can be grouped into one package, ensuring compactness of the optical amplifier.

Being separated from the optical amplification unit, the pumping light source can be placed in a location where heat radiating conditions are good and can suppress the effect of heat on the light amplification unit.

By the provision of the unit for rotating the plane of polarization of pumping light output from the pumping light source through a predetermined angle in the pumping light source unit, the operational instability of the light source due to return light can be eliminated.

According to the present invention, the optical amplifier is separated into the pumping light source unit containing the pumping light source and the optical amplification unit containing the amplification medium and a connector is therefore required to couple these units together. The connector may come off while a person is working. Not only has the pumping light high power, but it is converged by an optical fiber. In the event that the connector has come off, therefore, the person at work may be exposed to danger. To avoid such danger, the optical amplifier of the present invention is provided with means for detecting whether the connector is off or not.

BRIEF DESCRIPTION OF THE DRAWINGS

FIG. 7 shows a first arrangement of the pumping light source unit;

FIG. 8 shows a second arrangement of the pumping light source unit;

FIG. 11 shows a fifth arrangement of the pumping light source unit;

FIG. 12 shows a sixth arrangement of the pumping light source unit;

FIG. 13 shows a seventh arrangement of the pumping light source unit;

DESCRIPTION OF THE PREFERRED EMBODIMENTS

Figure 1A:
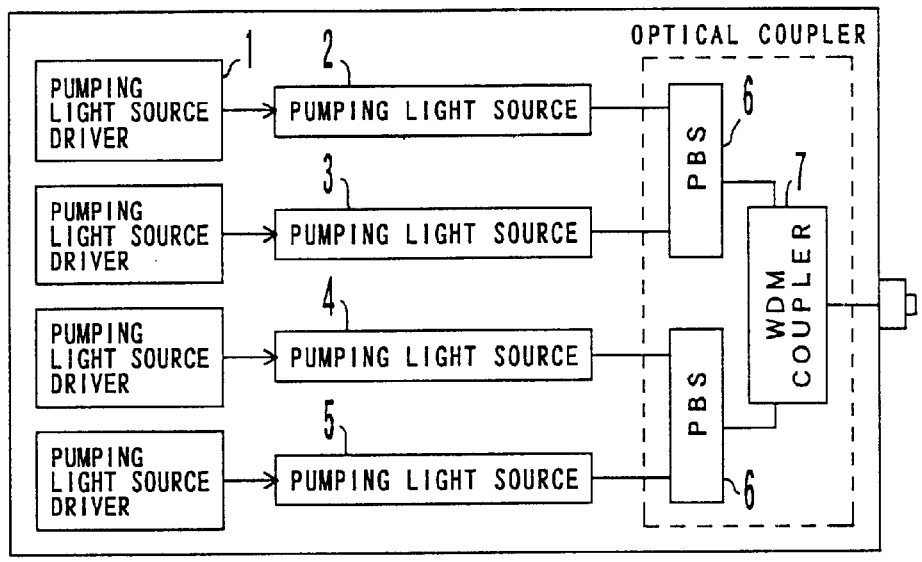
FIGS. 1A, 1B and 1C show arrangements of conventional pumping light source units.
Figure 1B:
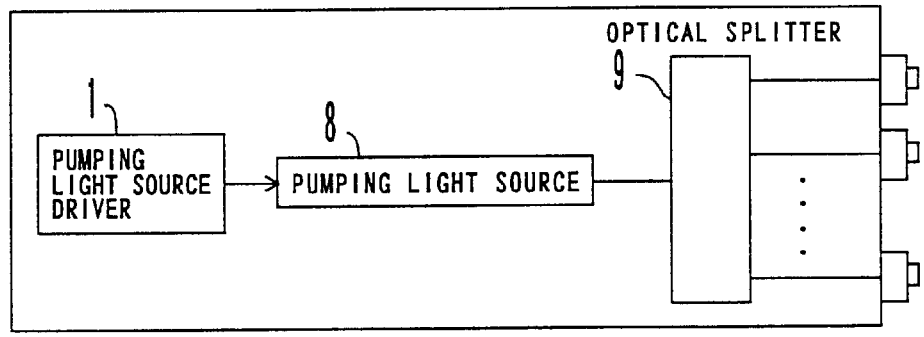
Figure 1C:
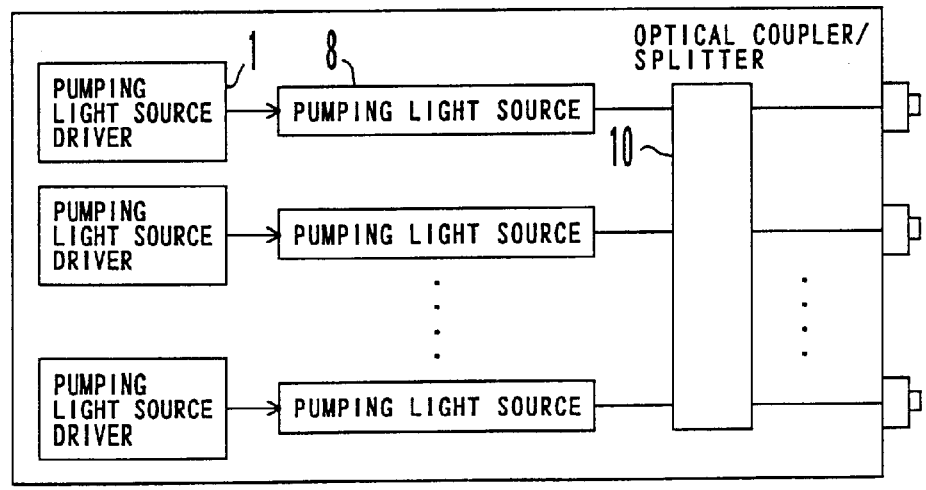
Figure 2:
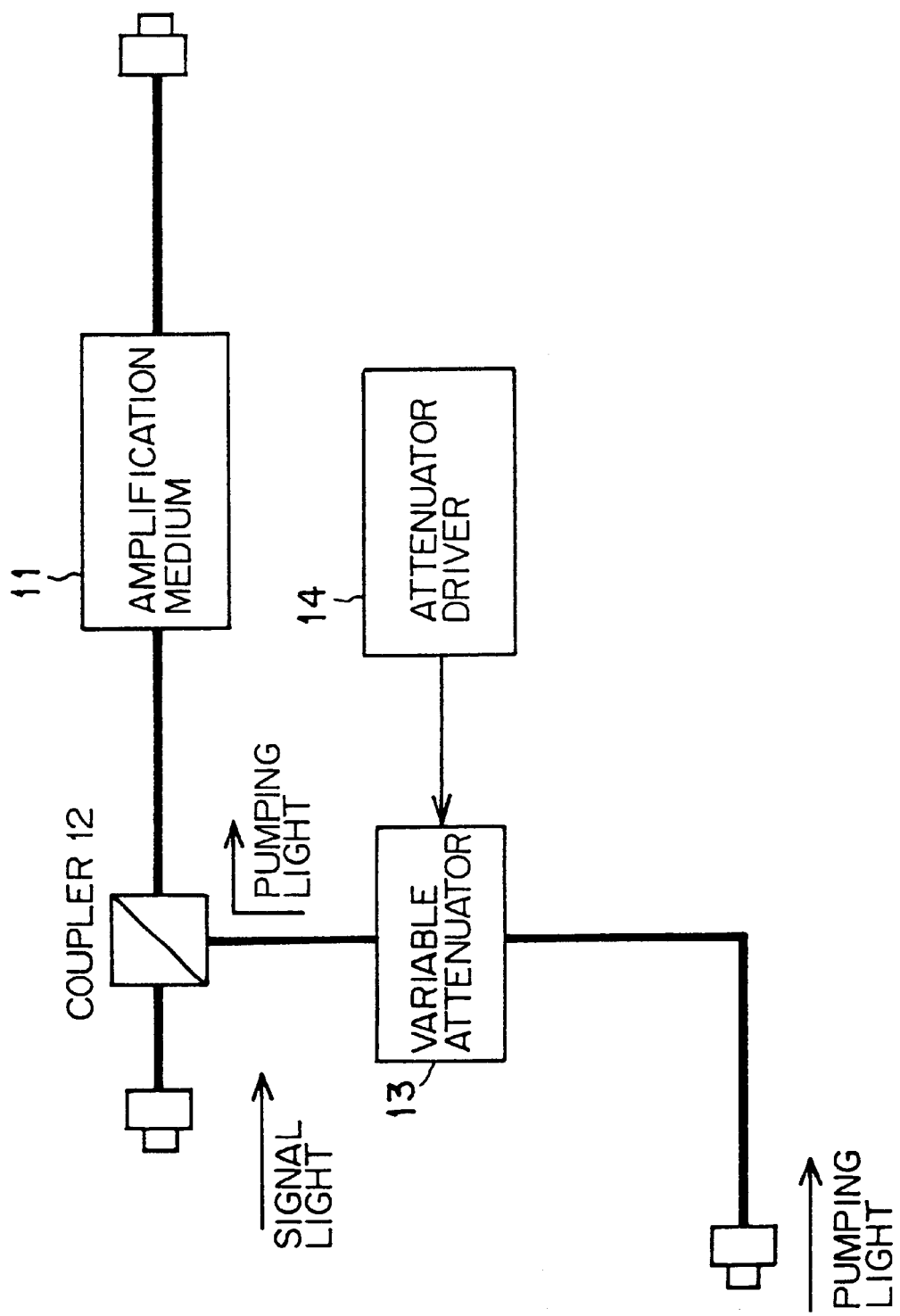
FIG. 2 illustrates the principle of the present invention.

Referring now to FIG. 2, there is illustrated the principle of the present invention.

An arrangement of an optical amplifier, with a pumping light source excluded, is illustrated here. Hereinafter, the other portion of an optical amplifier than a pumping light source is referred to as an optical amplification unit.

Reference numeral 11 denotes an amplification medium that amplifies signal light by being injected with pumping light, 12; a coupler that couples the signal light and the pumping light, 13; a variable attenuator that varies the supply amount of the pumping light to the amplification medium, and 14; a driver that drives the variable attenuator.

In the present invention, signal light and pumping light having its output level adjusted by the variable attenuator 13 driven by the driver 14 are input to the coupler 12, then coupled and transmitted to the amplification medium 11. The amplification medium consists of, for example, an erbium doped fiber. By the pumping light, the amplification medium (fiber amplifier) 11 is excited to initiate stimulated emission, thereby amplifying the signal light.

With the arrangement of FIG. 2, even if the light multiplexing degree increases, sufficient light amplification can be achieved by merely adjusting the output level of the pumping light with the variable attenuator 13.

In addition, control of the output power of the pumping light through the use of the variable attenuator 13 eliminates the need of controlling a pumping light source itself and moreover allows the pumping light source and the optical amplification unit to be arranged separately. Separating the heat emitting pumping light source from the optical amplification unit susceptible to heat ensures that the optical amplifier operates stably.

Figure 3A:
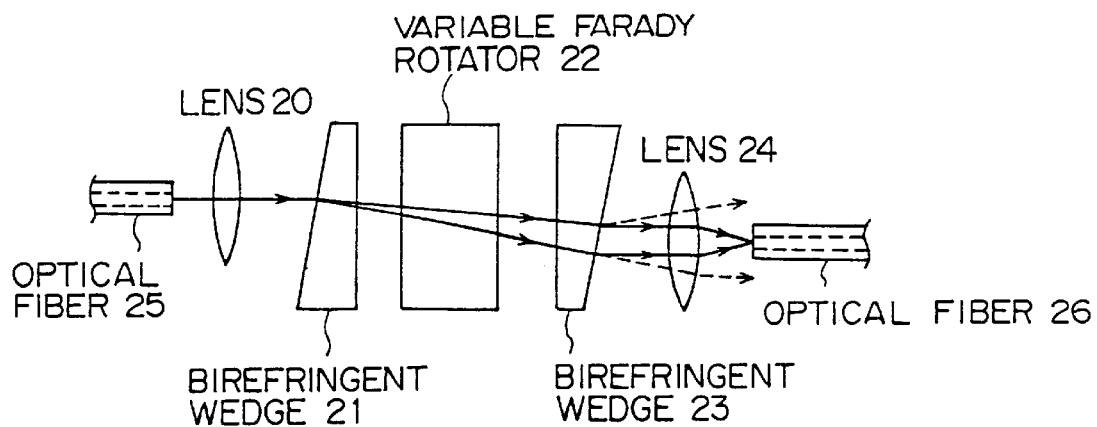
FIG. 3A shows an arrangement of a variable attenuator.
Figure 3B:
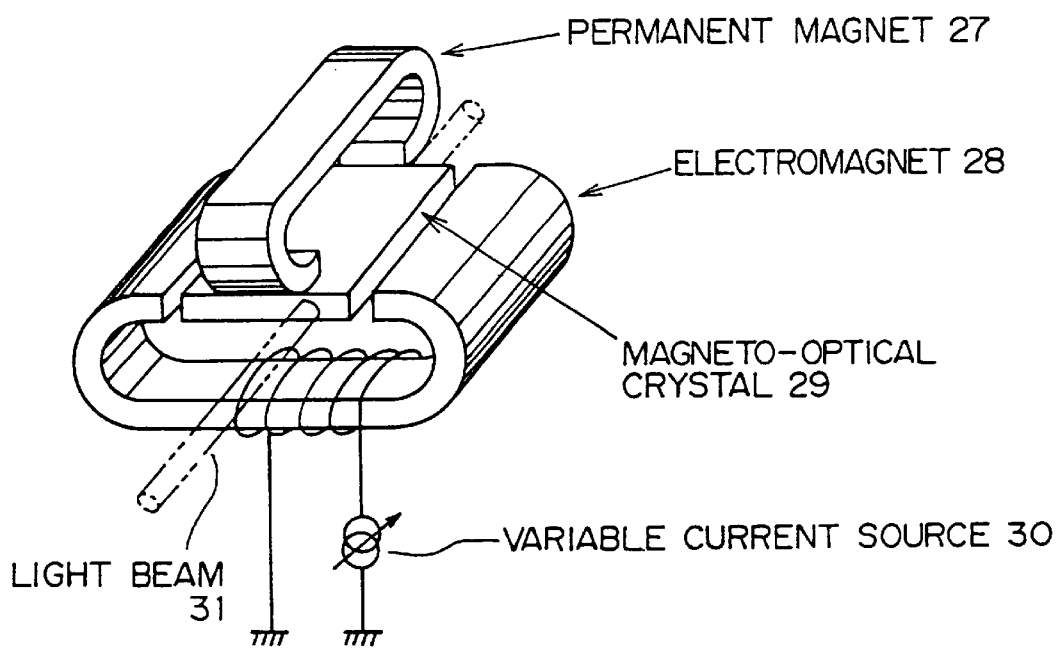
FIG. 3B shows an arrangement of the Faraday rotator of FIG. 3A.

FIGS. 3A and 3B illustrate an example of the variable attenuator.

FIG. 3A illustrates the entire arrangement of the variable attenuator.

The variable attenuator comprises a lens 20 which collimates incoming light from an optical fiber 25, a birefringent wedge 21 which splits an incoming light beam into two components, depending on a difference in polarization, a variable Faraday rotator 22 which can vary the angle of Faraday rotation, a birefringent wedge 23 which splits an incoming light beam into two components, and a lens 24 which focuses light emerging from the birefringent wedge 23. The light transmitted through the lens 24 is directed to an optical fiber 26, in which case, depending on the Faraday rotation angle in the Faraday rotator 22, there are two cases; the case where 100% of light is directed to the optical fiber, and the case where only a part of light is directed. When only a part of light is directed to the optical fiber, the intensity of light directed to the fiber is attenuated. On the other hand, when 100% of light is directed to the fiber, the intensity of light reaches the maximum level.

Thus, by controlling the Faraday rotation angle of the Faraday rotator, the degree to which a light path is bent in the birefringent wedge 23 is varied, allowing the intensity of light directed to the optical fiber 26 to be controlled.

FIG. 3B illustrates an example of the variable Faraday rotator.

This Faraday rotator comprises a permanent magnet 27, an electromagnet 28, a magneto-optical crystal 29, and a variable current source for supplying current to the electromagnet. A light beam 31 incident on the magneto-optical crystal 29 has its plane of polarization rotated by a magnetic field produced within the magneto-optical crystal by the permanent magnet 27 and the electromagnet 28. The direction of the magnetic field produced within the magneto-optical crystal changes with the magnitude of a magnetic field produced by the electromagnet. The angle of rotation of the plane of polarization of the light beam 31 is determined by that component of the magnetic field which is parallel to the direction in which the light beam travels. Thus, the angle of rotation of the plane of polarization of the light beam 31 can be changed by changing the direction of the magnetic field within the magneto-optical crystal 29 with its magnitude unchanged. Here, the permanent magnet 27 is used to saturate the magnetic field within the magneto-optical crystal 29. By saturating the magnetic field within the magneto-optical crystal, the magnitude of the internal magnetic field can be kept unchanged even if any magnetic field is produced by the electromagnet 28. By changing the direction of the internal magnetic field, the magnitude of the magnetic field component parallel to the direction in which the light beam 31 travels is increased or decreased. Thereby, the angle of rotation of the plane of polarization of the light beam 31 is controlled.

Figure 4:
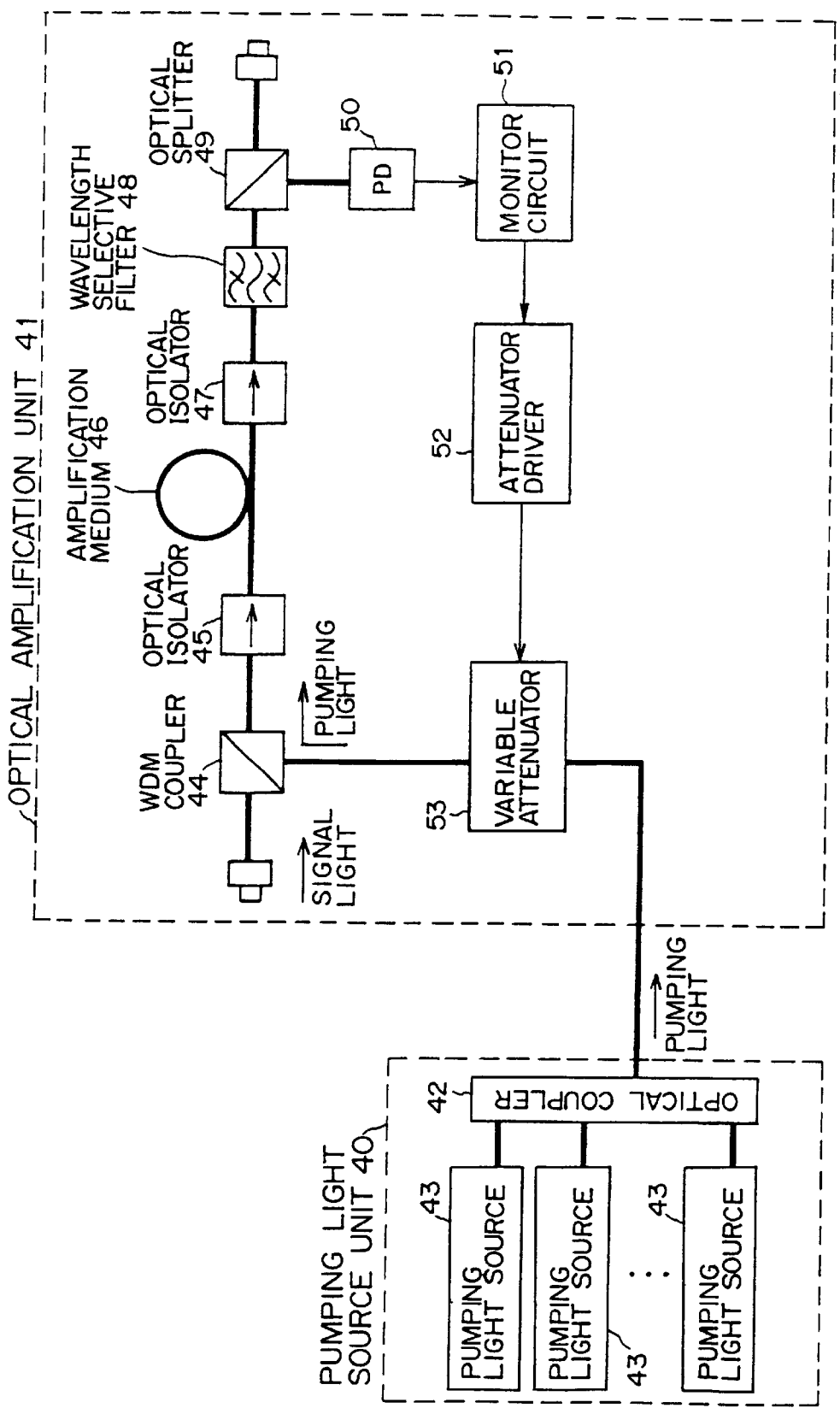
FIG. 4 shows a first embodiment of an optical amplifier of the present invention.

FIG. 4 illustrates a first embodiment of the optical amplifier of the present invention.

This optical amplifier comprises a pumping light source unit 40 and an optical amplification unit 41. The pumping light source unit couples pumping light emitted from two or more pumping light sources 43 in a coupler 42 for transmission to the optical amplification unit 41. The provision of two or more light sources allows a pumping light beam of large power to be transmitted to the optical amplification unit 41. If the pumping light source unit 40 is arranged such that a pumping light source or sources can be added, the optical amplifier requirements of having higher-power pumping light at a later time will be accommodated.

The optical amplification unit 41 is equipped with a WDM coupler 44 that couples incoming signal light and pumping light for transmission to an amplification medium 46 via an optical isolator 45. The amplification medium 46 is excited by the pumping light to amplify the light signal, which in turn is directed to an optical isolator 47. The amplified signal is then input to a wavelength selective filter 48 where only the signal is derived and then input to an optical splitter 49. When the signal light is amplified in the amplification medium 46 by the use of the pumping light, which emit signal light in the opposite direction to the transmission direction. The optical isolators 45 and 47 are provided to prevent the opposite direction signal light.

In the optical splitter 49, most of the signal light propagates straight, but part of the signal light branches off and its total output is detected by a photodiode 50. The output of the photodiode is input to a monitor circuit 51 to make a decision of whether or not the amplified signal light has reached a predetermined output level. If the decision is that the amplified signal light has not reached the predetermined output level, then the monitor circuit sends a signal to an attenuator driver circuit 52. In response to this signal, the driver circuit controls the variable attenuator 53 to thereby adjust the pumping light output to the fiber amplifier 46. By using such a feedback loop, the output level of the amplified signal light can be maintained constant. The monitor circuit 51 may be formed of a differential amplifier.

In this arrangement, being separated from the pumping light sources 43 grouped as a pumping light source unit, the optical amplification unit 41 will not suffer from heat emitted by the pumping light sources. In addition, unlike the conventional system, the pumping light output level is adjusted by the variable attenuator 53. Thus, even if the signal multiplexing degree in signal light is changed, a required output level of pumping light can be obtained readily by controlling the variable attenuator 53.

Figure 5:
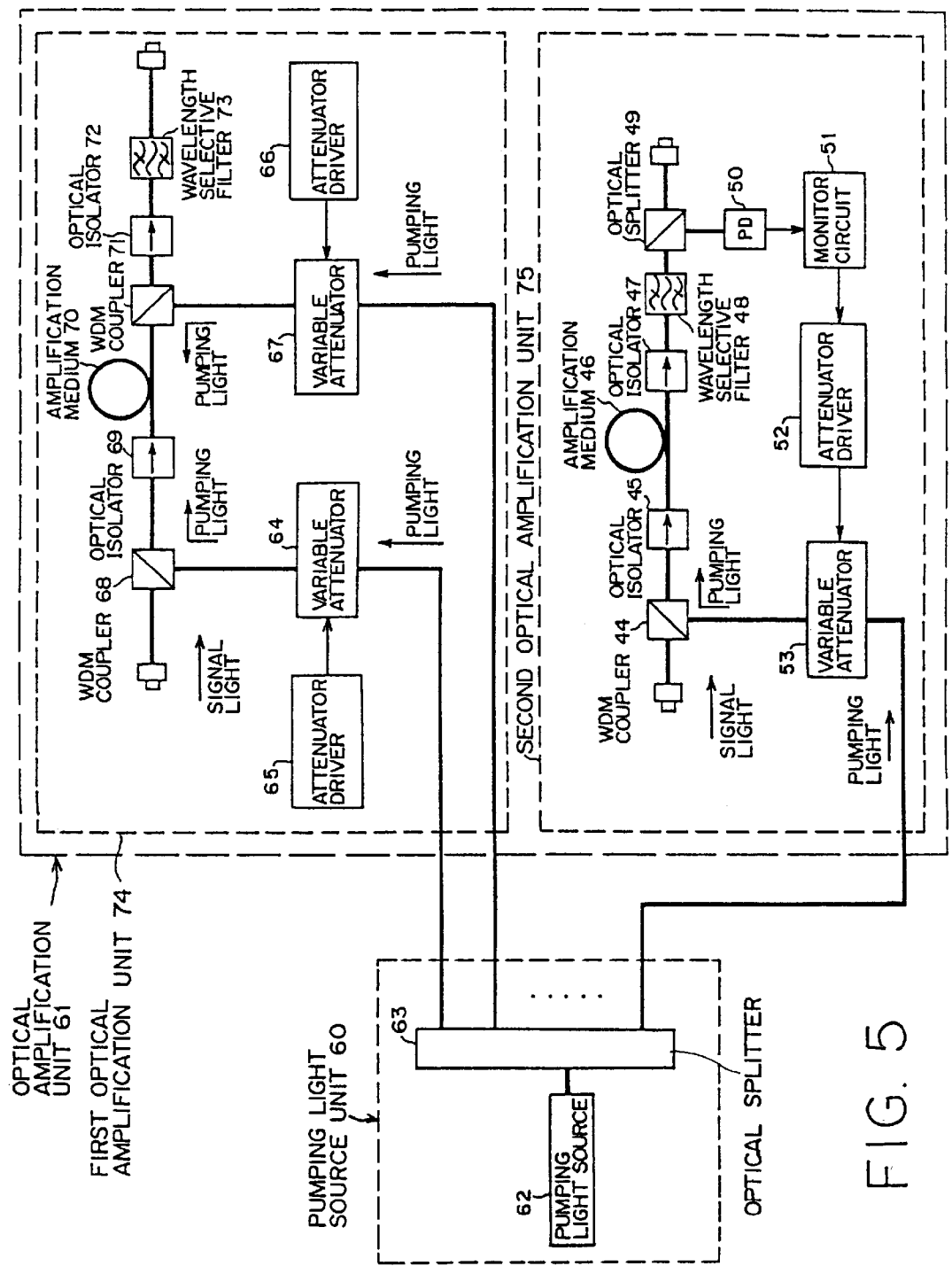
FIG. 5 shows a second embodiment of the optical amplifier of the present invention.

FIG. 5 illustrates a second embodiment of the optical amplifier of the present invention.

In this figure, the same reference numerals are used to denote parts corresponding to those in FIG. 4 and their descriptions are omitted.

The second embodiment of FIG. 5 is arranged such that a single light source 62 can provide sufficient pumping light to each of two or more amplification media 70 and 46. A pumping light source unit 60 comprises the pumping light source 62 and an optical splitter 63 that splits pumping light from the pumping light source for transmission to the amplification media 70 and 46. An optical amplification unit 61 comprises two or more amplifiers (first and second amplification units 74 and 75). The arrangement of the second optical amplification unit 75 is the same as that described in conjunction with FIG. 4 and hence its description is omitted here.

The first optical amplification unit 74 takes a configuration called bidirectional excitation in which pumping light is input to the amplification medium 70 from its both ends. Two pumping light beams from the pumping light source unit 60 are directed to the first optical amplification unit 74 where their output levels are respectively adjusted by variable attenuators 64 and 67 driven by driver circuits 65 and 66 and then coupled with signal light by WDM couplers 68 and 71. The two pumping light beams are input to the amplification medium 70 from its both ends to thereby amplifying the signal light. Optical isolators 69 and 72 are provided, as described previously, so as to remove spurious light that propagates in the opposite direction to the direction in which the signal light propagates. The light transmitted through the optical isolator 72 is input to a wavelength selective optical filter 73 where only the main signal light is extracted for transmission over a transmission path (not shown).

In the first optical amplification unit 74, unlike the second optical amplification unit 75, no feedback is used to maintain the output level of amplified signal light constant. Of course, a feedback arrangement may be provided in the first optical amplification unit 74 as well. In this case as well, the feedback arrangement is such that the output level of a fraction of main signal light emerging from the wavelength selective optical filter 73 is detected through the use of a photodiode and a monitor circuit and the variable attenuators 64 and 67 are controlled by the driver circuits 65 and 66 supplied with an output signal of the monitor circuit.

The first optical amplification unit 74 uses bidirectional excitation, which is effective in using a very long erbium-doped fiber for the amplification medium 70. That is, in such a case, pumping light input from the WDM coupler 68 to an end of the amplification medium 70 will be dissipated before it reaches the other end of the medium. By inputting pumping light from the WDM coupler 71 to the other end of the amplification medium as well, therefore, the pumping light is allowed to spread over the entire medium. According to this scheme, even if the amplification medium 70 consists of a very long erbium-doped fiber, the entire medium can be used to amplify signal light.

Figure 6:
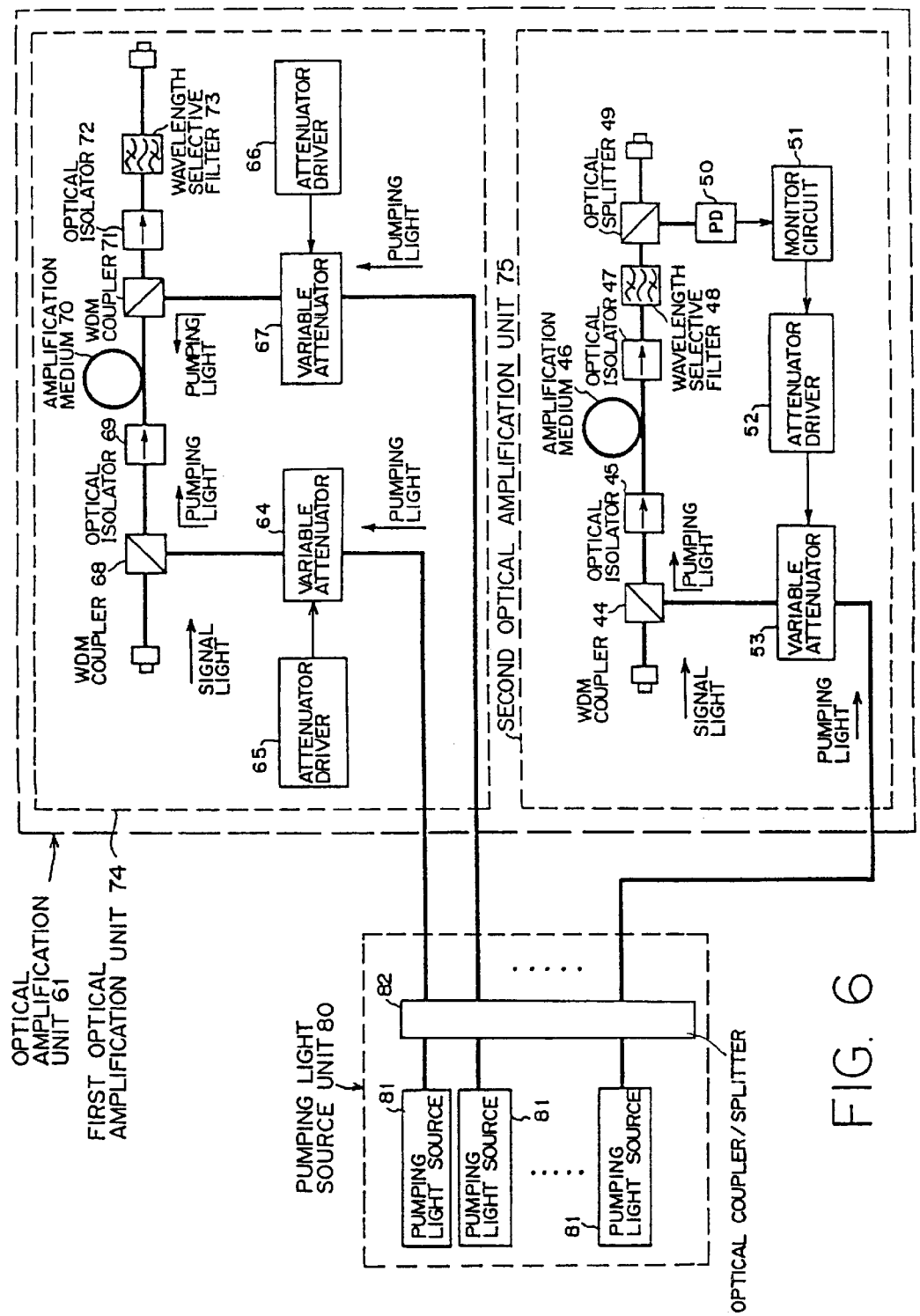
FIG. 6 shows a third embodiment of the optical amplifier of the present invention.

FIG. 6 shows a third embodiment of the optical amplifier of the present invention.

In FIG. 6, as in FIG. 5, the optical amplification unit 61 comprises the first and second optical amplification units 74 and 75 and like reference numerals are used to denote corresponding parts to those in FIG. 5.

Using bidirectional excitation, the first optical amplification unit 74 in the optical amplification unit 61 is arranged such that pumping light is directed to both ends of the amplification medium 70. The advantage of this scheme has been described previously. The second optical amplification unit 75, arranged identically to that of FIG. 4, uses only one pumping light beam. As with the second optical amplification unit 75, in the first optical amplification unit 74 feedback control may be performed on the variable attenuators 64 and 65.

In FIG. 6, a pumping light source unit 80 containing pumping light sources and the optical amplification unit 61 are provided separately and, in the optical amplification unit 61, pumping light from the pumping light source 80 to the amplification media 70 and 46 is controlled by the variable attenuators 64, 67 and 53. Such an arrangement prevents heat emitted by the pumping light sources 81 from adversely affecting the stable operation of the optical amplification unit 61 and allows the required pumping light to be obtained only by controlling the variable attenuators 64, 67 and 53. In addition, by arranging the pumping light source unit so as to allow a pumping light source or sources to be added to its optical coupler/splitter 82, a requirement of providing such high-power pumping light as is not obtainable from the previously installed pumping light sources 81 can be accommodated simply by adding a pumping light source or sources to the pumping light source unit 80.

The pumping light source unit 80 of FIG. 6 is equipped with two or more pumping light sources 81 to thereby provide an intense pumping light that is not obtainable from a single pumping light source. That is, lights output from the pumping light sources 81 are coupled and then split by an optical coupler/splitter 82 for transmission to the amplification media 70 and 46. As described previously, by coupling lights from two or more pumping light sources and then splitting them for transmission to two or more amplification media, there is provided an advantage that all the amplification media can operate with substantially the same characteristics. That is, variations in operating characteristics between amplification media due to variations in a manufacturing process among pumping light sources, which would occur if one pumping light source were allocated for one amplification medium, can be eliminated.

FIG. 7 illustrates a first arrangement of the excitation light source unit.

The pumping light source unit of FIG. 7 is provided with two or more pumping light sources 90 to supply one amplification medium with a high-power pumping light which is not obtainable from a single pumping light source. Unlike the previous arrangement, in this arrangement a variable attenuator 93 and an attenuator driver circuit 92 are installed in the pumping light source unit as opposed to the optical amplification unit. In this case, in order to adjust the output level of the pumping light in response to the output level of signal light amplified by the amplification medium, it is required to input a feedback control signal to the driver circuit 92 from the optical amplification unit (not shown). As described previously, since the pumping light source unit and the optical amplification unit are assembled as separate units, electrical wiring is needed to input the feedback control signal to the attenuator driver circuit 92. Although the feedback control arrangement will not be particularly mentioned below, it will be apparent to those skilled in the art.

FIG. 8 shows a second arrangement of the pumping light source unit.

In this arrangement as well, the pumping light source is equipped with variable attenuators 97 and an attenuator driver circuit 96. This arrangement is suitable for a case where a single pumping light source 94 has an output high enough to provide pumping light to each of two or more amplification media (not shown). An optical splitter 95 splits light from the pumping light source 94. The variable attenuators 97 each adjust the output level of corresponding pumping light from the optical splitter. This is intended to tune each of the amplification media individually. Although, in FIG. 8, the variable attenuators 97 are controlled in common by the one driver circuit 96, one driver circuit may be provided for each variable attenuator. For pumping light output control feedback, a monitor circuit is provided to detect the output level of signal light amplified by an amplification medium to produce a control signal and the control signal is then applied to the attenuator driver circuit 96 connected to the monitor circuit.

Figure 9:
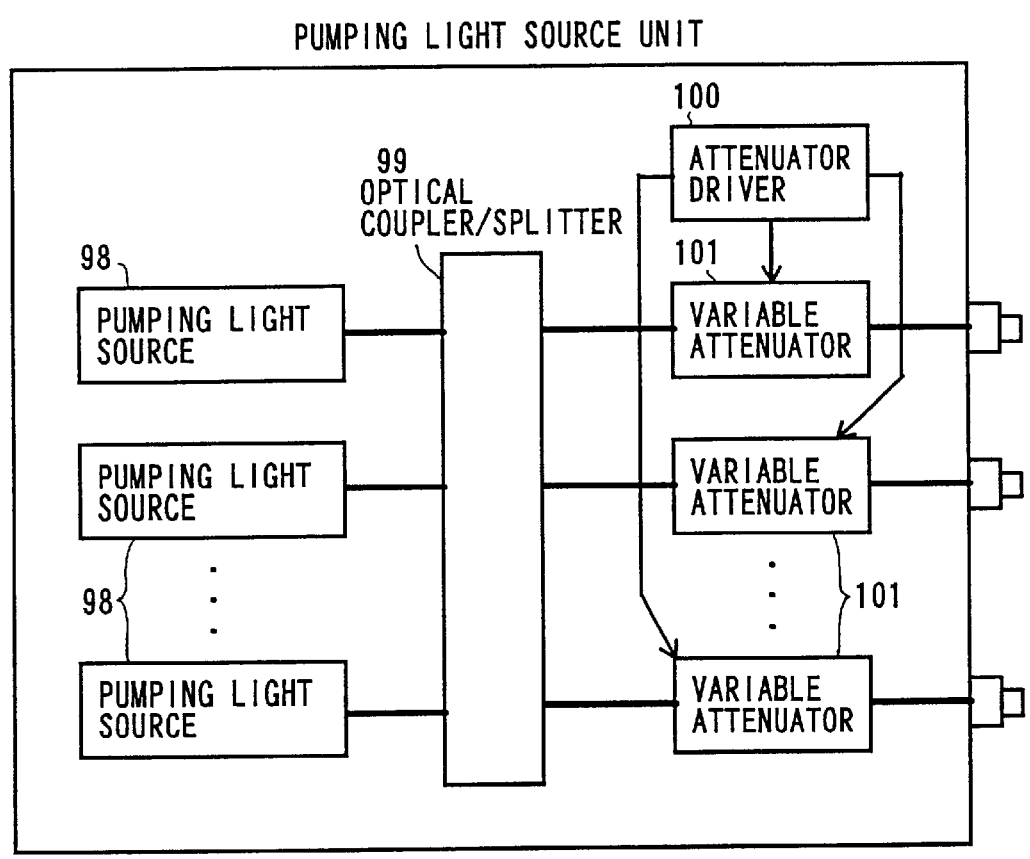
FIG. 9 shows a third arrangement of the pumping light source unit.

FIG. 9 shows a third arrangement of the pumping light source unit.

In this arrangement, lights from two or more pumping light sources 98 are first coupled and then split by an optical coupler/splitter 99. This is intended to obtain pumping light of a required output level by coupling the two or more pumping light sources 98 and to prevent variations in wavelength among lights to the amplification media by first coupling all lights from the pumping light sources into one light beam and then dividing it. The division of one light eliminates variations in wavelength among light beams sent to the amplification media, allowing each amplification medium to operate uniformly. In the arrangement of FIG. 9 as well, variable attenuators 101 and an attenuator driver circuit 100 are provided in the pumping light source unit. The variable attenuators 101 are each provided for a light output of the optical splitter and controlled by the driver circuit 100. As described previously in conjunction with FIG. 8, an attenuator driver circuit may be provided for each of the variable attenuators. For pumping light output feedback control, a control signal is applied from a monitor circuit not shown to the attenuator driver circuit 100.

In the arrangements of FIGS. 8 and 9, pumping light divided by the optical splitter 95 or optical coupler/splitter 99 is power-controlled by each variable attenuator 97 or 101. This is equivalent to varying the dividing ratio in the splitter or coupler/splitter.

Figure 10:
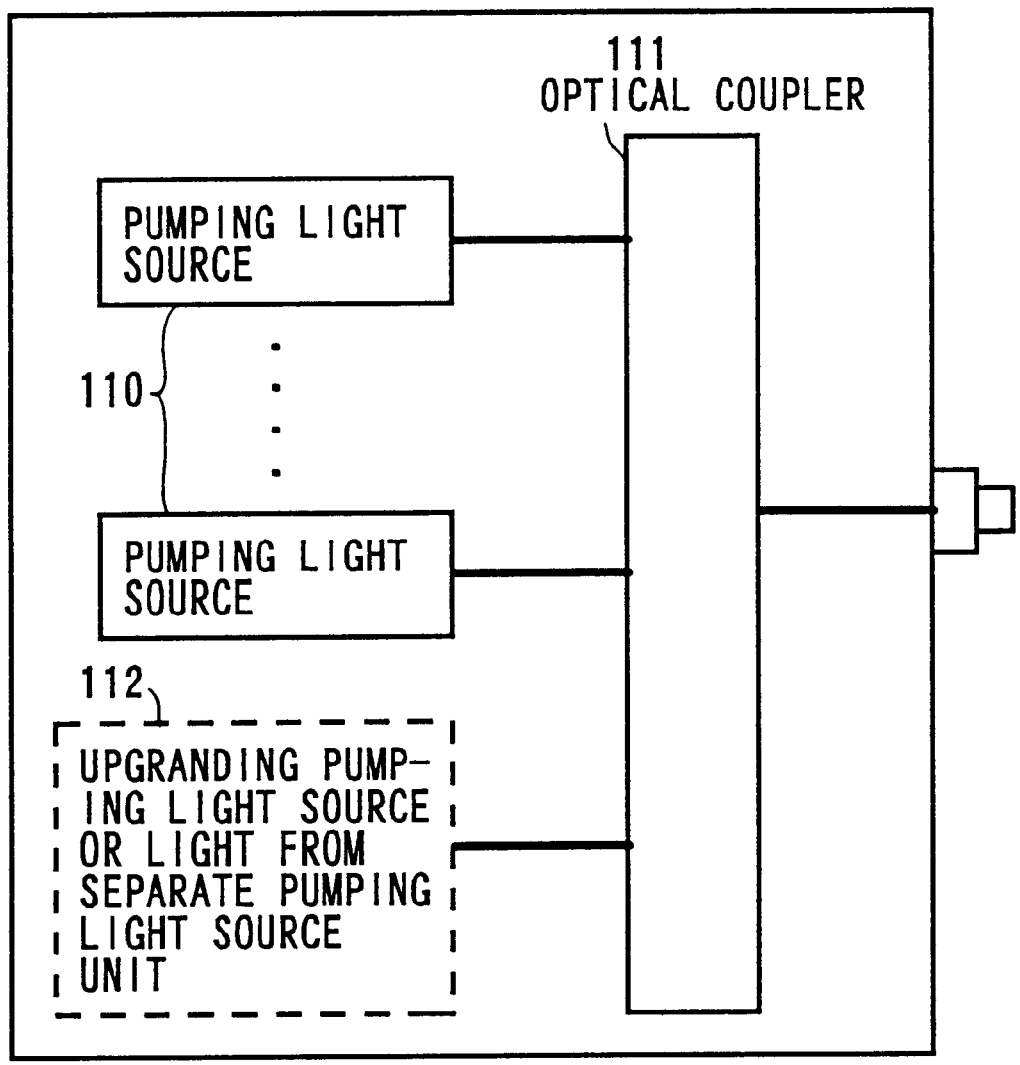
FIG. 10 shows a fourth arrangement of the pumping light source unit.

FIG. 10 shows a fourth arrangement of the pumping light source unit.

This pumping light source unit is arranged such that lights from two or more pumping light sources 110 are coupled by an optical coupler 111 into one for application to a single amplification medium and moreover the number of light sources connectable to the coupler can be increased or decreased. For example, the optical coupler 111 has light source connectors and optically coupling components built in which are larger in number than pumping light sources required at optical transmission system startup, and a minimum required number of pumping light sources is connected at the time of system installation. When there arises a need to increase the optical multiplexing degree in the optical transmission system (for system upgrade), an additional pumping light source or sources (including a separate pumping light source unit or units) are coupled to the connectors of the optical coupler 111 which have been provided in advance. That is, when the optical multiplexing degree of the optical transmission system increases, the power of signal light increases accordingly. In this case, when the power of pumping light remains unchanged, the gain of the fiber amplifier drops. It is thus required to elevate the output level of the pumping light. For this reason, the pumping light source unit is arranged to allow a pumping light source or sources to be added. This avoids the need to install more pumping light sources than is necessary at the stage of initial investment. In addition, higher-power pumping light requirements at the time of system upgrade can be accommodated readily.

FIG. 11 shows a fifth arrangement of the pumping light source unit.

In the arrangement of FIG. 11, lights from two or more pumping light sources 110 are first coupled and then separated for transmission to each amplification medium. In this case as well, an optical coupler/splitter 113 is provided beforehand with connectors and optical elements which allow an additional pumping light source or sources to be added. When higher-power pumping light becomes necessary for system upgrade, an upgrading pumping light source or a separate pumping light source unit can be connected to the optical coupler/splitter 113.

As shown in FIG. 10 or FIG. 11, since the optical coupler 111 or optical coupler/splitter 113 is formed to allow for connection of additional pumping light source or sources, a minimum required number of pumping light sources suffices at system startup. For system upgrade, a pumping light source or sources have only to be added to obtain pumping light at a required level. Thus, the initial investment in the optical transmission system can be controlled to a minimum and the system can be upgraded readily.

FIG. 12 shows a sixth arrangement of the pumping light source.

This arrangement contains a variable attenuator 115 and an attenuator driver circuit 114 in addition to the arrangement of FIG. 10. Although, in the arrangement of FIG. 10, the variable attenuator 115 and the attenuator driver circuit 114 are provided in the optical amplification unit not shown, they may be provided in the pumping light source unit as shown in FIG. 12. This arrangement corresponds to the arrangement of FIG. 7 but differs in that the optical coupler 111 is formed to allow for addition of a pumping light source or sources. As described in conjunction with FIG. 7, to feedback control the pumping light output from the optical coupler 111, wiring is needed to input a control signal to the attenuator driver circuit 114.

FIG. 13 shows a seventh arrangement of the pumping light source unit. This arrangement, corresponding to the arrangement of FIG. 11, has variable attenuators 116 each corresponding to a respective one of pumping light outputs of an optical coupler/splitter 113 and an attenuator driver circuit 117 for driving the attenuators. This arrangement allows pumping light output to each amplification medium to be controlled individually. This is substantially equivalent to varying the light dividing ratio in the optical coupler/splitter 113.

The arrangement of FIG. 13, which is adapted to supply pumping light to multiple amplification media, can meet situations where the optical multiplexing degree is increased only for some of transmission paths and the pumping light output level need not be elevated for all the amplification media that the pumping light source accommodates. That is, with system upgrade, pumping light from a pumping light source 112 or separate pumping light source unit is input to the optical coupler/splitter 113 and the light attenuation level in each variable attenuator 116 is set individually. More specifically, pumping light of the same output level as prior to the upgrade is applied to amplification media for which the pumping light output level does not need to be elevated, while pumping light of a higher output level is applied to amplification media for which the pumping light output level needs to be elevated. Thus, the arrangement of FIG. 13 can accommodate various system upgrades.

As described previously, in the arrangement of FIG. 13, one attenuator driver circuit may be provided for each variable attenuator. For feedback control of the output level of each pumping light, a control signal is applied from a monitor circuit, not shown, to the attenuator driver circuit.

Figure 14:
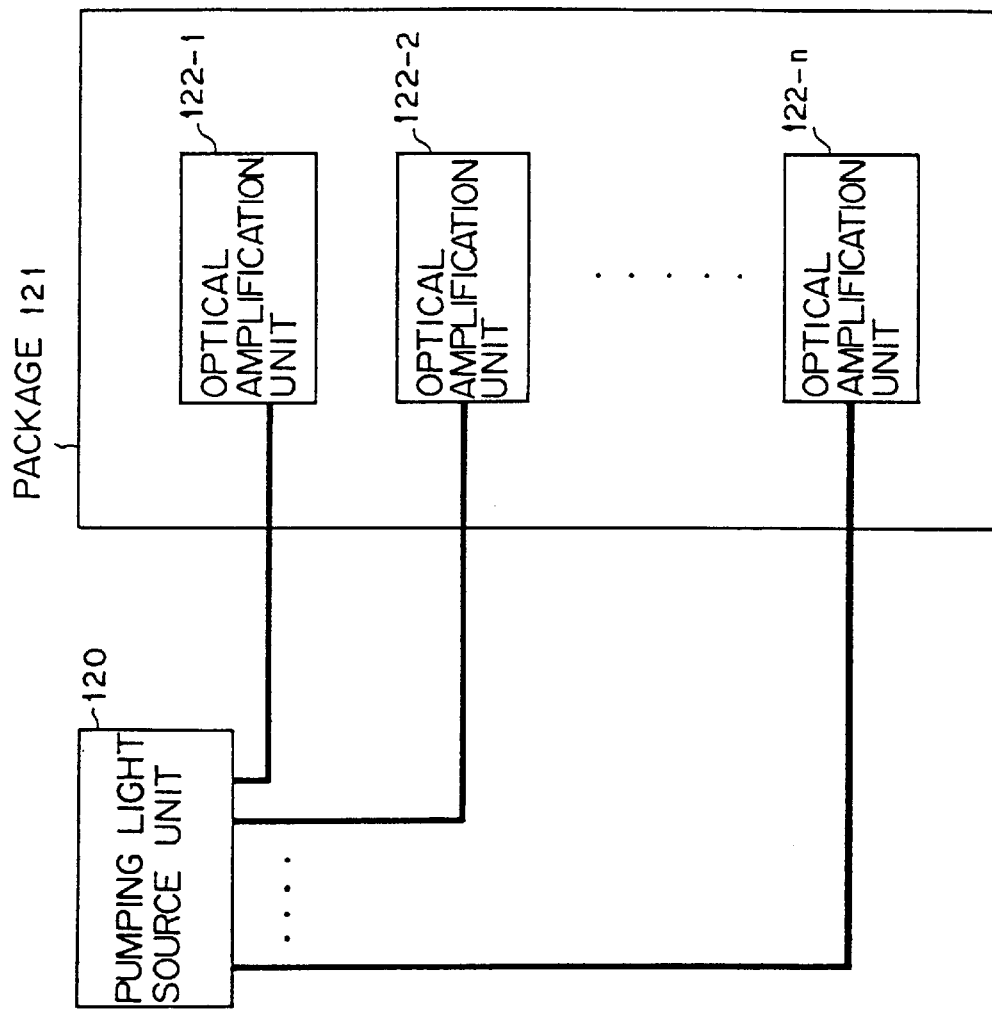
FIG. 14 is a schematic representation of the optical amplifier.

FIG. 14 is a schematic of an optical amplifier.

The optical amplifier of FIG. 14 is arranged such that a pumping light source unit 120 is independent of an optical amplification unit and many optical amplification units are incorporated into a package 121. By incorporating optical amplification units 122-1 to 122-n into one package in this manner, optical amplifiers on multiple light transmission paths can be integrated, which will not take up too much space in the optical communications device. The pumping light source unit 120 is installed independently of the optical amplifier unit integrating package 121, which provides greater freedom in placement of the pumping light source unit in the optical communications device. Thus, the pumping light source unit 120, which emits a large amount of heat and may adversely affect the amplification media in the optical amplification units, can be placed in a cooling-efficient location within the optical communication device e.g., in the upper portion of the device or near to a fan.

To provide an optical amplifier with uniform characteristics, optical amplification units of the same type are connected to the pumping light source unit, For this reason, pumping lights having the same wavelength or the same wavelength component are input to the amplification media in the optical amplification units, which allows the optical amplifier to have uniform characteristics regardless of the wavelength dependence of the amplification media.

FIGS. 15 to 18 show various arrangements of the optical amplification unit described in conjunction with FIGS. 4 and 5.

Figure 15:
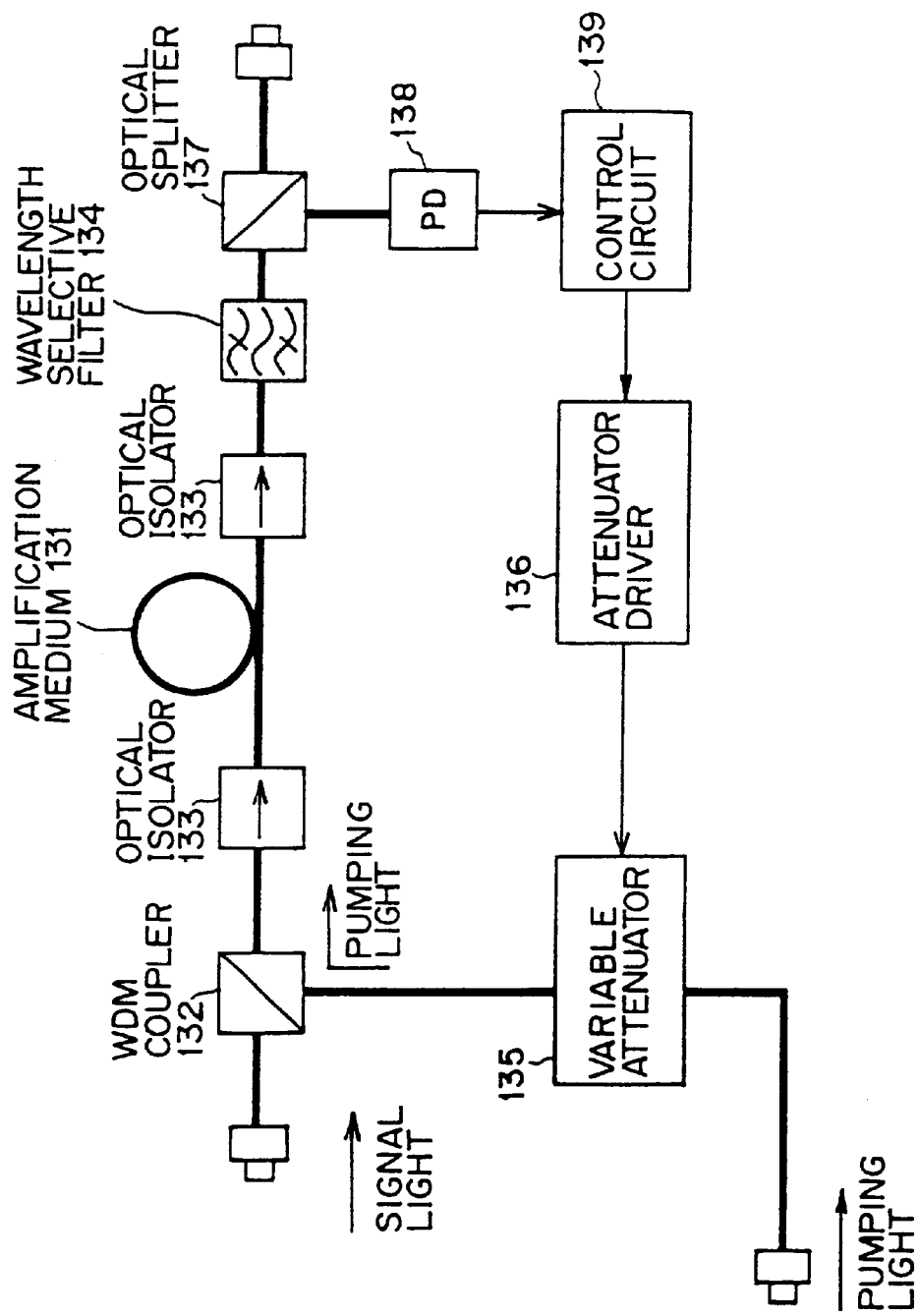
FIG. 15 shows a first arrangement of the optical amplification unit.

FIG. 15 shows a first arrangement of the optical amplification unit.

In FIG. 15, 131 denotes an amplification medium (fiber amplifier) consisting of an erbium-doped fiber, 132; a WDM coupler for coupling pumping light and signal light, 133; an optical isolator for preventing oscillation of light propagating in the reverse direction, 134; a wavelength selective optical filter which allows signal light wavelength components to pass through, 135; a variable attenuator which varies the supply amount of pumping light to the amplification medium, 136; an attenuator driver circuit for supplying a drive current to the optical attenuator, 137; an optical splitter for branching part of signal light emerging from the filter for the purpose of controlling the output level of the pumping light, 138; a photodiode for converting signal light branched by the optical splitter into an electrical signal, and 139; a control circuit which receives the electrical signal and performs necessary calculations to send a control signal to the attenuator driver circuit.

The optical amplification unit of FIG. 15 performs automatic level control (ALC) to keep the level of output light constant and has the same arrangement as that described in conjunction with FIG. 4. Part of signal light is branched by the optical splitter 137 and then converted into an electrical signal, which, in turn, is compared in magnitude with a preset value in the control circuit 139. The ALC is performed by controlling the drive current to the variable attenuator 135 via the driver circuit 136 so that a difference between the electrical signal and the preset value will reach zero.

Separating the optical amplifier into the optical amplification unit containing the amplification medium susceptible to heat and the pumping light source unit containing a pumping light source or sources allows the amplification medium to operate stably and the pumping light source unit to have facilities for system upgrades as described previously. Further, unlike the conventional amplifier in which the output level of pumping light is controlled by varying current to a pumping light source, the present invention performs the pumping light level control by varying the power of pumping light to the amplification medium using the variable attenuator while keeping the output level of the pumping light source constant. This makes it possible to form an optical amplifier from separate units: an optical amplification unit and a pumping light source unit.

Figure 16:
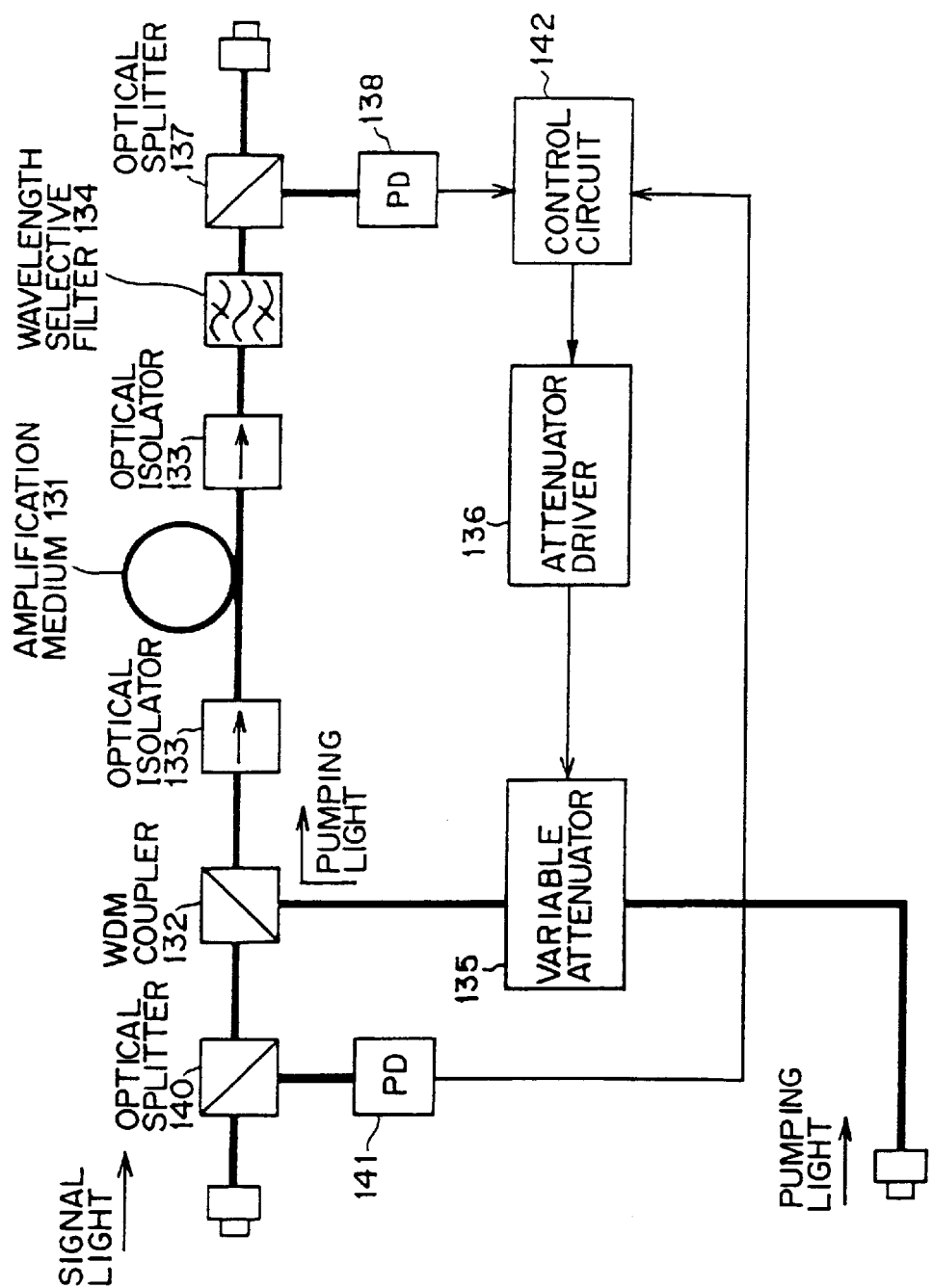
FIG. 16 shows a second arrangement of the optical amplification unit.

FIG. 16 shows a second arrangement of the optical amplification unit.

In this figure, like reference numerals are used to denote corresponding parts to those in FIG. 15 and their descriptions are omitted.

In FIG. 16, 140 denotes an optical splitter which branches part of incoming signal light to control the output level of pumping light, 141; a photodiode which converts the signal light branched by the optical splitter into an electrical signal, and 142; a control circuit which receives the electrical signals produced by the photodiodes 138 and 141 and performs necessary calculations to produce a control signal for the attenuator driver circuit 136.

This amplification unit is arranged to perform automatic gain control (AGC) to keep the signal light gain constant. Part of output signal light branched by the splitter 137 is converted into an electrical signal by the photodiode 138, while part of incoming signal light branched by the optical splitter 140 is converted into an electrical signal by the photodiode 141. These electrical signals are applied to the control circuit 142 where the ratio of output signal light to input signal light, i.e., the gain, is obtained. This gain is compared with a preset value to produce a difference therebetween. The AGC control is performed by controlling current to the variable attenuator 135 via the driver circuit 136 so that the difference will reach zero.

The WDM coupler 132, the optical isolator 133, the wavelength selective filter 134 and the amplification medium 131 operate as described previously.

Figure 17:
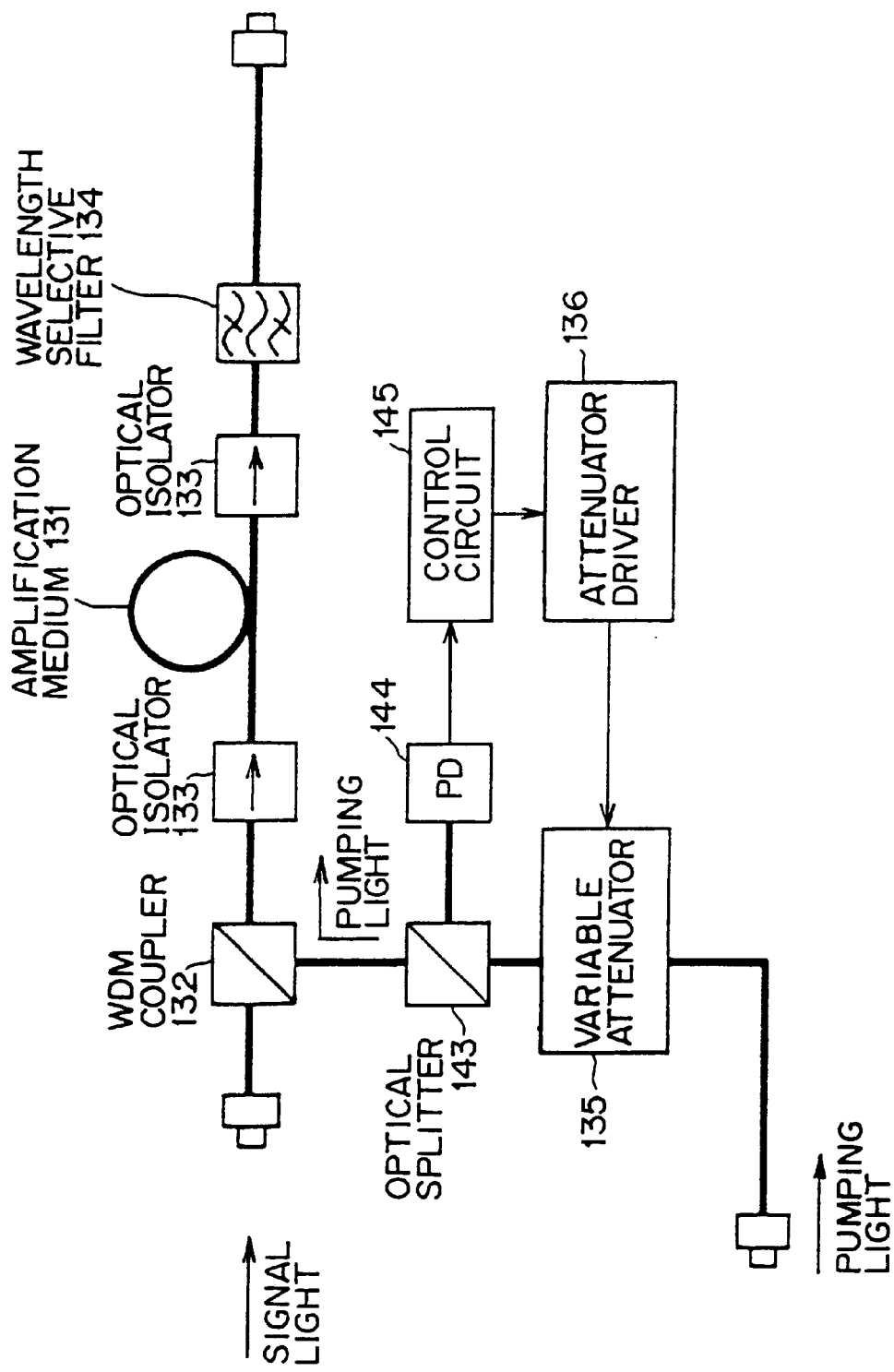
FIG. 17 shows a third arrangement of the optical amplification unit.

FIG. 17 shows a third arrangement of the optical amplification unit.

In this figure, like reference numerals are used to denote corresponding parts to those in FIGS. 15 and 16 and their descriptions are omitted.

In FIG. 17, 143 denotes an optical splitter which branches part of pumping light for control, 144; a photodiode which converts the pumping light branched by the optical splitter into an electrical signal, and 145; a control circuit which receives the electrical signal produced by the photodiode and performs necessary calculations to produce a control signal for the attenuator driver circuit 136.

This amplification unit is arranged to perform automatic power control (APC) to keep the amount of pumping light to the amplification medium constant. Part of pumping light branched by the optical splitter 143 is converted into an electrical signal by the photodiode 144. The electrical signal is applied to the control circuit 145 where it is compared with a preset value to produce a difference therebetween. The APC control is performed by controlling current to the variable attenuator 135 via the driver circuit 136 so that the difference will reach zero.

The pumping light having a constant level is coupled with incoming signal light in the WDM coupler 132 to amplify the signal light in the amplification medium 131. The amplified signal light is applied to the wavelength selective filter 134 from which only the main signal light is derived for transmission over a light transmission path (not shown). As described previously, the optical isolator 133 is provided to avoid oscillation of light propagating in the reverse direction.

In this arrangement in which the power of pumping light is constant, when higher-power pumping light becomes necessary for system upgrade, the preset value in the control circuit 145 must be changed to a suitable value. However, if there is no need of increasing the power of pumping light, the arrangement will function identically to the ALC control and the AGC control.

Figure 18:
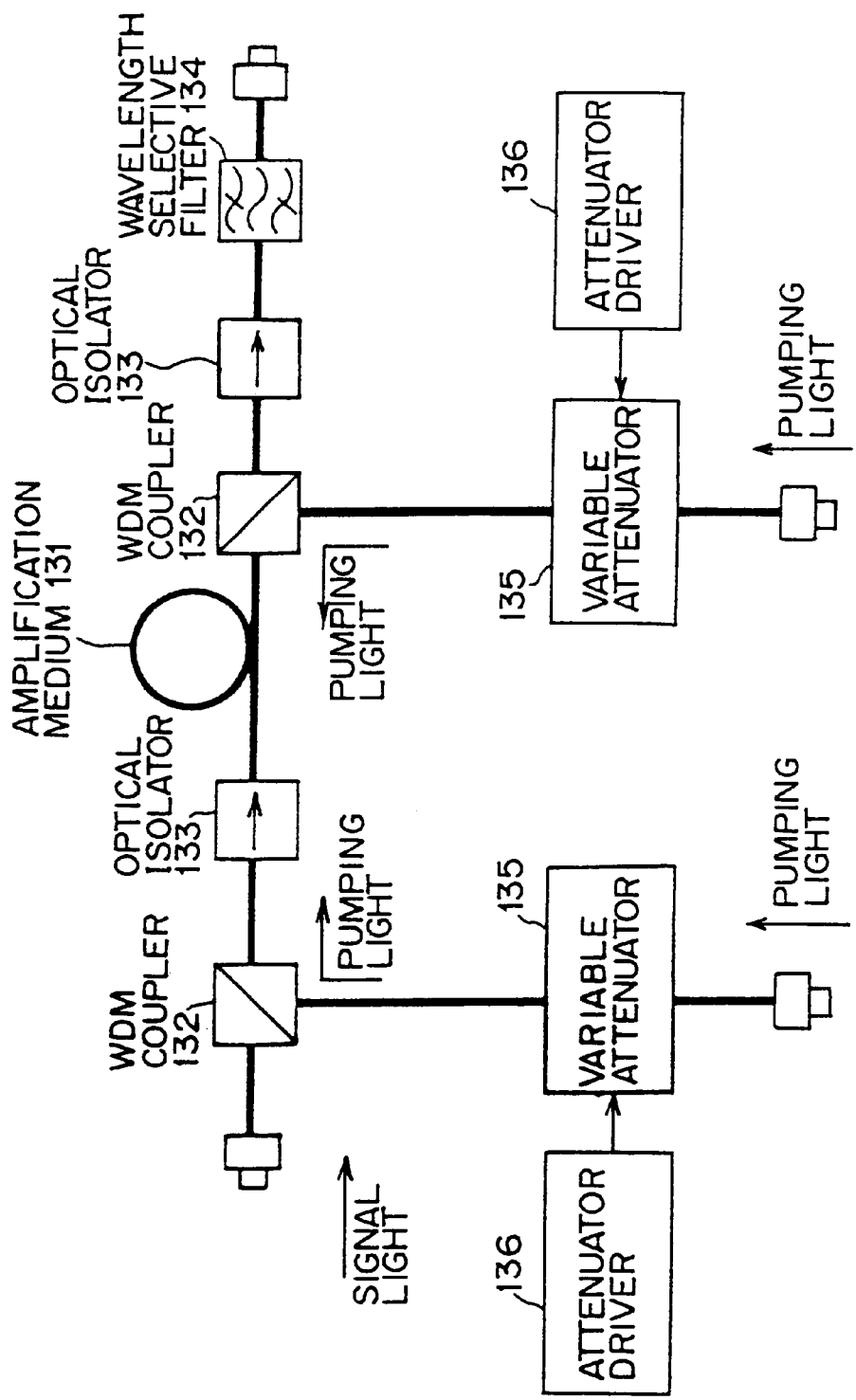
FIG. 18 shows a fourth arrangement of the optical amplification unit.

FIG. 18 shows a fourth arrangement of the optical amplification unit. This arrangement is adapted for bidirectional pumping light amplification. By varying current to each of variable attenuators 135 through a corresponding one of driver circuits 136, the supply amount of pumping light to the amplification medium from each of its input and output ends can be controlled individually. In the arrangement of FIG. 18, two pumping light sources are used: one for pumping light supply to the amplification medium from its input end, and one for pumping light supply from the output end.

It is desirable that a common pumping light source be used to supply pumping light to the amplification medium from its both ends. An arrangement that uses such a common pumping light source is shown in FIG. 19.

The operation of each component for bidirectional excitation has been described in conjunction with FIG. 5 and the description is thus omitted here.

Figure 19:
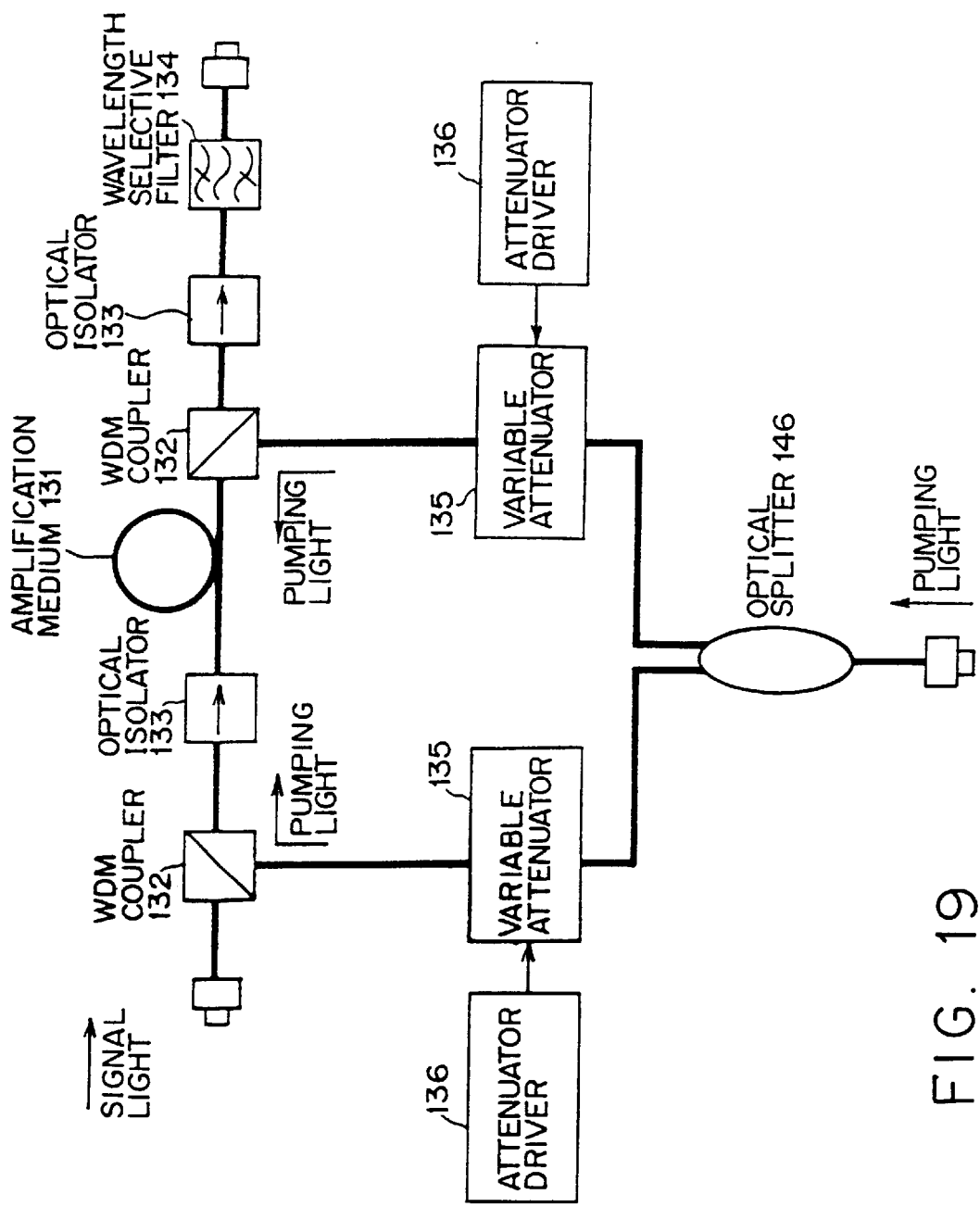
FIG. 19 shows a fifth arrangement of the optical amplification unit.

FIG. 19 shows a fifth arrangement of the optical amplification unit.

In FIG. 19, like reference numerals are used to denote corresponding parts to those in FIGS. 15 to 18 and their descriptions are omitted. In this figure, 146 denotes an optical splitter which splits pumping light.

The optical amplification unit of FIG. 19 has the same bidirectional excitation arrangement as the unit of FIG. 18 but differs in that pumping light from a pumping light source is split by the optical splitter 146 and then input to the variable attenuators 135. Instead of placing the variable attenuators 135 as shown in FIG. 19, a single variable attenuator may be placed ahead of the optical splitter 146 to vary the amount of pumping light before it is split by the splitter. In this case, the ratio between the supply amount of pumping light to the amplification medium from its input end and the supply amount of pumping light from the output end depends on the dividing ratio in the optical splitter.

Figure 20:
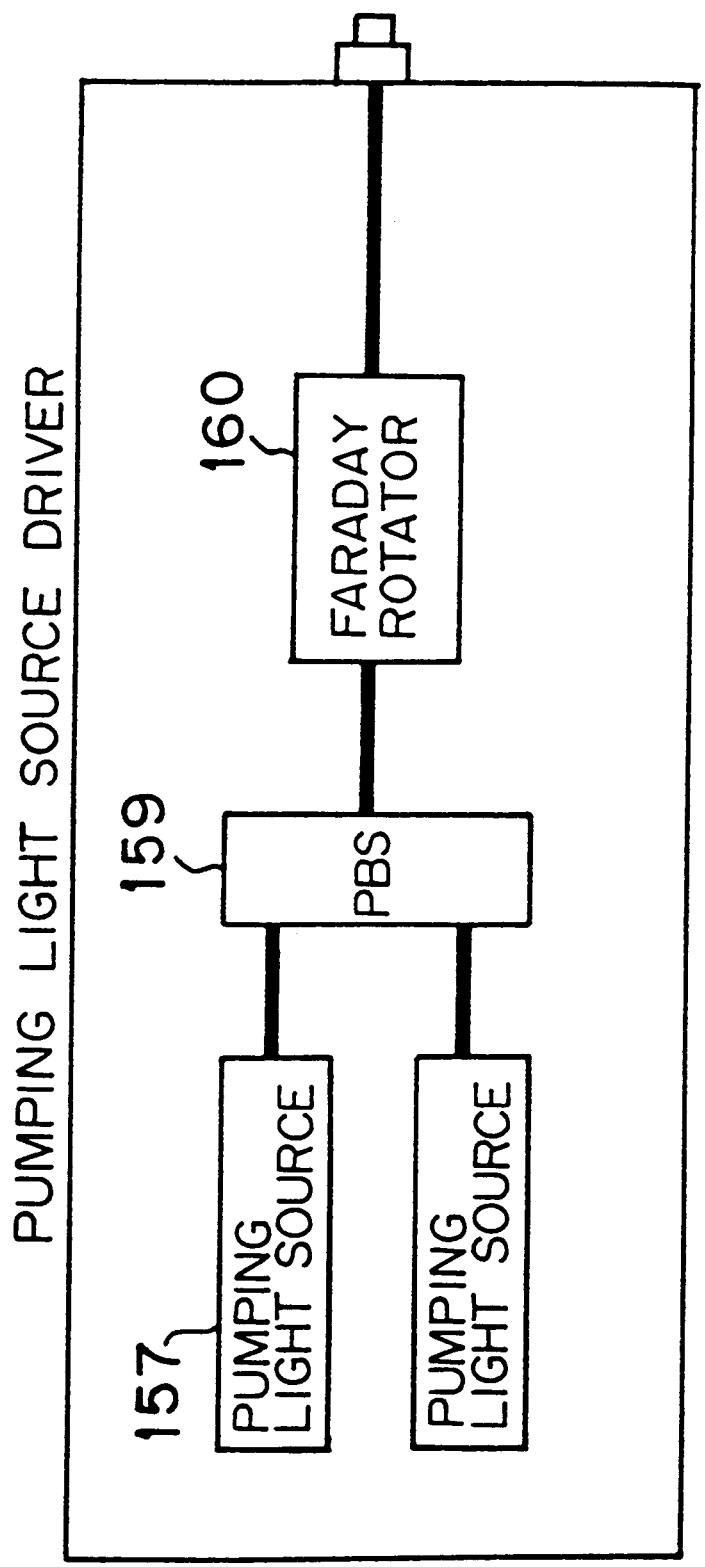
FIG. 20 shows an arrangement of the pumping light source unit adapted to operate the pumping light source stably.

FIG. 20 shows an arrangement for operating pumping light sources stably in the pumping light source unit of the optical amplifier.

In general, the connectors adapted for optical components, though having varying degrees of reflectiveness, reflect no little incoming light to produce return light. When the return light falls on a pumping light source, its operation becomes unstable, causing the wavelength of oscillating light to drift. This is because, when a pumping light source consists of a laser which uses a resonator structure, the return light upon incidence disturbs the resonant state of the resonator.

To solve such a problem, there are provided two pumping light sources 157 and 158 of different wavelengths. The pumping light sources 157 and 158 are respectively set to output light beams of λ1 and λ2 in wavelength which are linearly polarized perpendicular to each other. The output beams of the light sources 157 and 158 are polarization-coupled by a polarization beam splitter (PBS) 159. A Faraday rotator 160 is set to rotate the plane of polarization of incoming light through 22.5 degrees. After having been polarization-coupled, the pumping light has its plane of polarization rotated through 22.5 degrees by the Faraday rotator 160 and then output from the pumping light source unit. Return light, resulting from the output pumping light being reflected from optical components within the optical amplifier, has its plane of polarization rotated through 22.5 degrees again in the Faraday rotator. It thus follows that the return light has its plane of polarization rotated through 45 degrees with respect to the original light (the output light of the PBS). Thus, the return light will have wavelength components of λ1 and λ2.

Thus, if the return light has a component different in wavelength from the output light of an pumping light source, its action of disturbing the resonant state within the resonator of a laser as the pumping light source will be suppressed. The operational instability of the pumping light source due to return light can therefore be eliminated.

That is, output light of pumping light sources (LDs) having different output wavelengths is used as pumping light so that part of the pumping light that is reflected by optical components and falls on the pumping light source unit will not be uniform in wavelength. This allows return light to an LD to contain a wavelength component other than the output wavelength of the LD, thus eliminating the operational instability of the optical amplifier.

Figure 21:
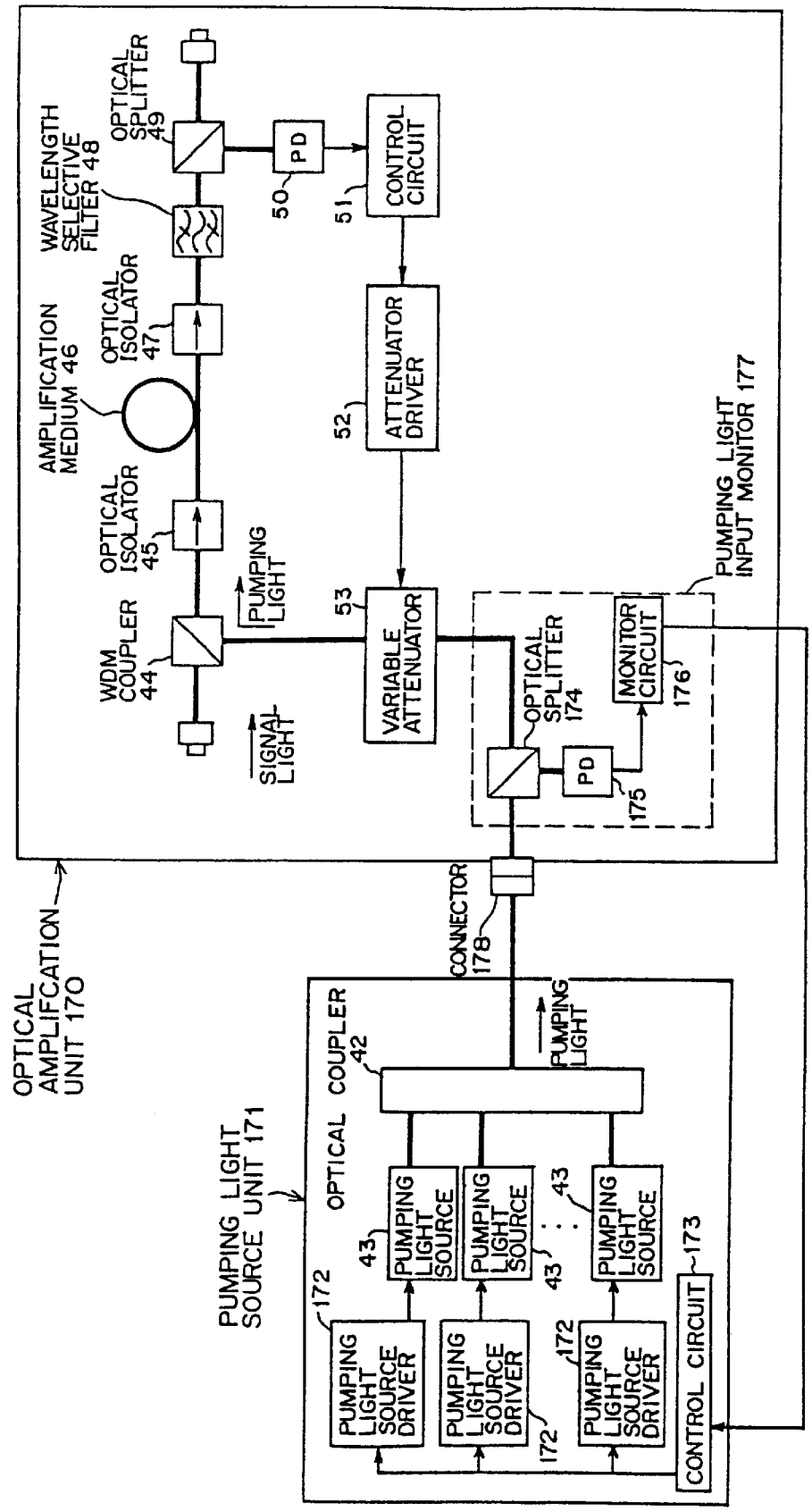
FIG. 21 shows a fourth embodiment of the optical amplifier of the present invention.

FIG. 21 shows a fourth arrangement of the optical amplifier.

In this arrangement, optical amplification unit 170 is provided with a pumping light input monitor 177 which comprises an optical splitter 174 for branching part of pumping light, a photodiode 175 for receiving the part of pumping light branched by the optical splitter, and a monitor circuit 176 for monitoring the output level of the received pumping light. The other components of the optical amplification unit remain unchanged from those of FIG. 4 and their descriptions are thus omitted. In this arrangement, the output level of pumping light is monitored by the pumping light input monitor 177 to activate an alarm, such as a buzzer or lamp, when the output level of pumping light has dropped abnormally.

In addition, when the input amount of pumping light to the optical amplification unit 170 has dropped, the monitor circuit sends an electrical signal to the pumping light source unit 171 to shut off the pumping light source unit. Alternatively, when the pumping light source unit has an output adjusting optical attenuator (not provided in the arrangement of FIG. 21), the attenuator is controlled to increase its light attenuation amount to lower the output amount of pumping light to zero or a safety level.

Such control is performed by sending a control signal from the monitor circuit 176 to a control circuit 173 in the pumping light source unit 171, thereby causing light source drivers 172 to shut off pumping light sources 43 or causing a variable attenuator, if provided, to increase the light attenuation amount.

Such control is intended to detect a state where a connector 178 that connects the pumping light source unit 171 and the optical amplification unit 170 together has become disconnected. Not only has the pumping light output from the pumping light source unit 171 very high power, but it is also converged by an optical fiber. If, when the connector has come off, a person at work should be exposed to pumping light, this would entail great dangers to his or her skin and eyes. For this reason, the pumping light input monitor 177 is provided in the optical amplification unit to detect the output level of the pumping light, thereby monitoring the state of the connector 178. When the output level of the pumping light has dropped below a predetermined level, the connector is considered to have become disconnected, whereupon the alarm is sounded or the pumping light source is shut down to keep the person at work from dangers.

Figure 22:
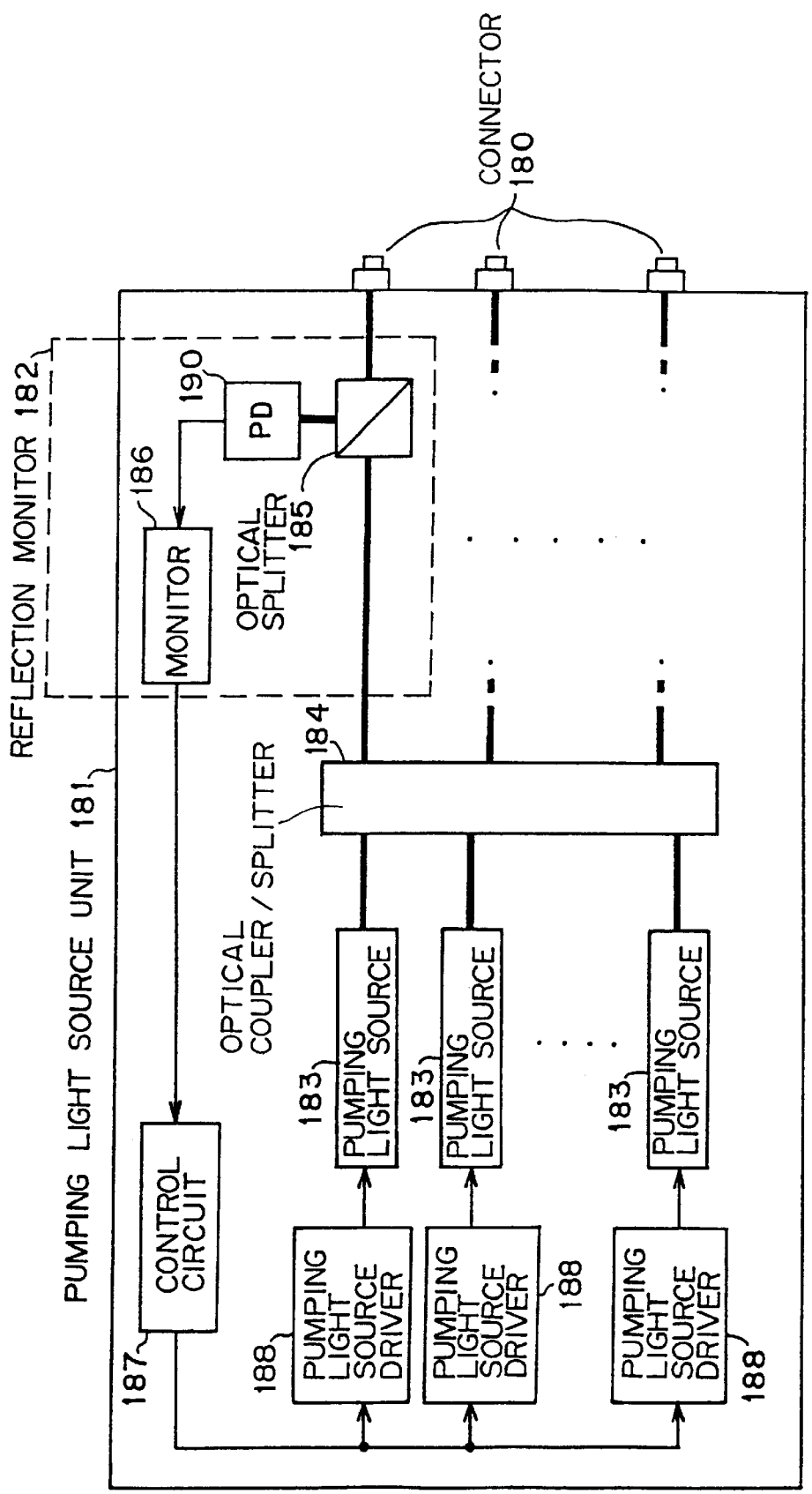
FIG. 22 shows an arrangement adapted to monitor connection between the optical amplification unit and the pumping light source unit.

FIG. 22 shows another arrangement for monitoring the connection between the optical amplification unit and the pumping light source unit.

In this arrangement, light beams from multiple pumping light sources 183 are first coupled and then split by an optical coupler/splitter 184. The pumping light source unit is also connected with the optical amplification unit by means of connectors 180. In this case as well, the state of each connector is monitored.

That is, there is provided a reflection monitor 182, in which reflected light from the connector 180 is branched by an optical splitter 185 and then detected by a photodiode 190 which sends the detected output to a monitor circuit 186. When the connector is off, the power of the reflected light from the connector becomes higher than when the connector is connected. When the power of the reflected light has become higher than a preset level, the monitor circuit 186 produces an alarm signal. Otherwise, when a variable attenuator is provided in the pumping light source unit, the monitor circuit controls the attenuator to reduce the output amount of pumping light to zero or a safety level. Alternatively, the monitor circuit 186 sends a control signal to a control circuit 187 to cause driver circuits 188 to shut off the pumping light sources 183.

Figure 23A:
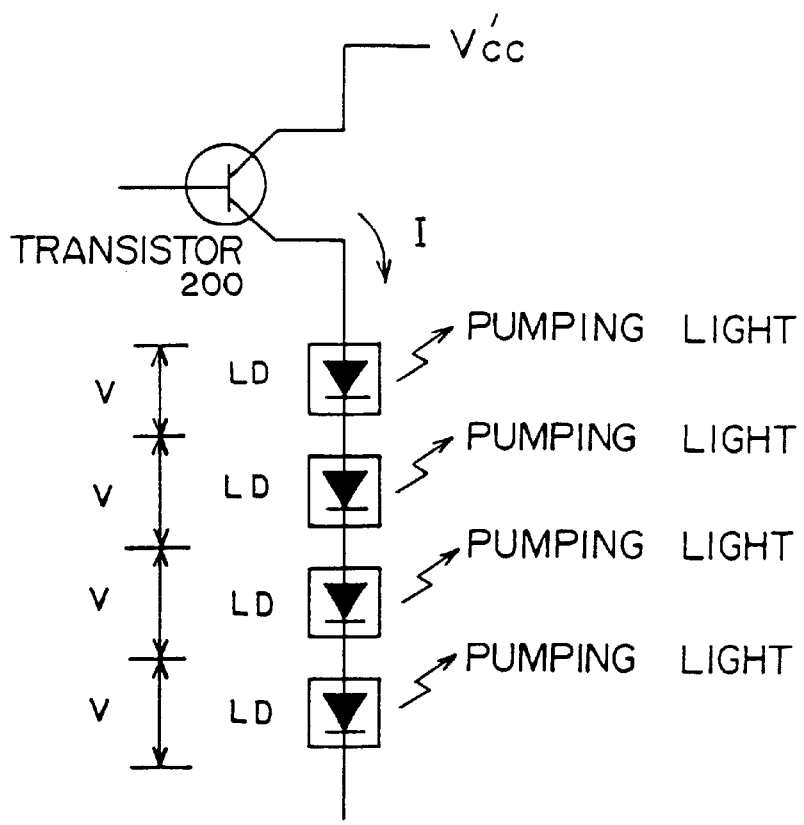
FIGS. 23A and 23B are diagrams for use in explanation of how to connect a pumping light source or sources in the pumping light source unit.
Figure 23B:
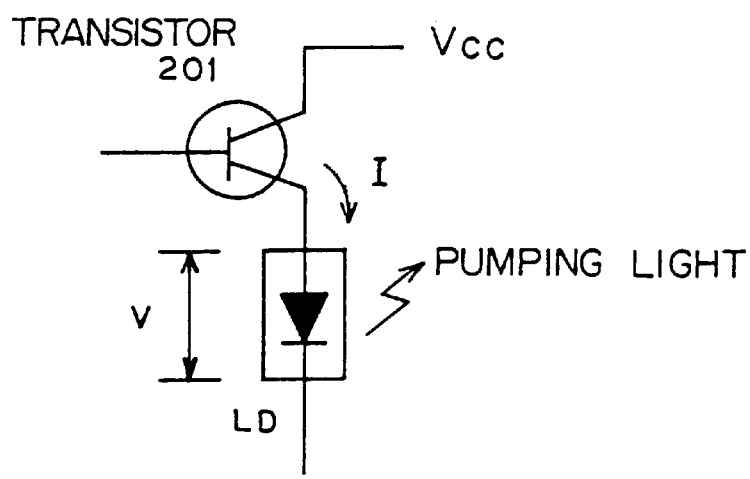

FIGS. 23A and 23B illustrate how pumping light sources are connected in the pumping light source unit.

In FIG. 23A, pumping light sources (laser diodes; LDs) are connected in series with a transistor 200. This arrangement requires less transistors and less power dissipation than when each of the LDs is driven individually.

As an example, consider a case where, as shown in FIG. 23B, one LD is attached to a transistor 201. Assuming that the voltage across the LD is V and the current flowing through the transistor is I, the power dissipation in the transistor becomes P=(Vcc−V) I. On the other hand, when multiple LDs are connected in series as shown in FIG. 23A, the power dissipation in the transistor 200 becomes P'= (V'cc−4V) I where Vcc=(1+α)V, V'cc=(4+α') V, and a and α' are assumed to be nearly equal to each other.

A comparison in transistor power dissipation between the arrangements of FIGS. 23A and 23B indicates that 4P−P'= (4α−α') and hence 4P is larger than P'. Thus, a combination of series-connected LDs and one transistor requires less power dissipation than with multiple combinations of each of an LD and a transistor. Further, less transistors are required.

However, the pumping LDs need not be connected in series. For example, if pumping LDs are connected in parallel within the light source driver circuits, a failing LD will be replaced with a good one more easily than with the series connection, providing redundancy.

The embodiments have been described in terms of an optical fiber amplifier. An optical semiconductor amplifier can also be used which uses a semiconductor as the amplification medium.

The output power of pumping light to the amplification medium is adjusted by a variable attenuator, making it easy to adjust the output power of pumping light.

The optical amplifier is separated into the pumping light source unit containing a pumping light source or sources and the optical amplification unit susceptible to heat, which allows the amplification medium in the optical amplification unit to be free from the influence of heat emitted by the pumping light source and operate stably.

System upgrades, such as are intended to increase the signal multiplexing degree, can be accommodated by adjusting the attenuation amount of the variable attenuator. By arranging the pumping light source unit so that an additional pumping light source or sources can be attached thereto, it becomes unnecessary to install redundant pumping light sources at the time of system installation, allowing the initial investment to be cut.

When pumping light is supplied to multiple amplification media from the pumping light source unit, the power of pumping light can be adjusted for each amplification medium.

What is claimed is:

1. An optical amplifier for amplifying incoming signal light in response to pumping light applied thereto, comprising:
   a variable attenuator for varying the input level of the pumping light applied to the optical amplifier to thereby tune the amplification characteristic of the optical amplifier; and
   an optical coupler unit supplying the pumping light by coupling pumping light beams generated by multiple pumping light sources into one beam,
      wherein the multiple pumping light sources and the optical coupler means are assembled into a unit, and the unit is arranged such that pumping light from a separate pumping light source or a separate unit can be additionally coupled to the optical coupler means.

2. An optical amplifier for amplifying incoming signal light in response to pumping light applied thereto, comprising:
   a variable attenuator for varying the input level of the pumping light applied to the optical amplifier to thereby tune the amplification characteristic of the optical amplifier; and
   an optical coupler/splitter unit supplying the pumping light by coupling pumping light beams generated by multiple pumping light sources into one beam and then splitting the one beam into a plurality of beams,
      wherein the multiple pumping light sources and the optical coupler means are assembled into a unit, and the unit is arranged such that pumping light from a separate pumping light source or a separate unit can be additionally coupled to the optical coupler/splitter means.

3. An optical amplifier for amplifying incoming signal light in response to pumping light applied thereto, comprising:
   a variable attenuator for varying the input level of the pumping light applied to the optical amplifier to thereby tune the amplification characteristic of the optical amplifier; and
   an optical coupler unit supplying the pumping light by coupling pumping light beams generated by multiple pumping light sources into one beam,
      wherein the multiple pumping light sources, the optical coupler means and the variable attenuator are assembled into a unit.

4. An optical amplifier for amplifying incoming signal light in response to pumping light applied thereto, comprising:
   a variable attenuator for varying the input level of the pumping light applied to the optical amplifier to thereby tune the amplification characteristic of the optical amplifier; and
   an optical splitter unit supplying the pumping light by splitting a pumping light beam by one pumping light source into a plurality of pumping lights, wherein the pumping light source, the optical splitter means and the variable attenuator are assembled into a unit.

5. An optical amplifier for amplifying incoming signal light in response to pumping light applied thereto, comprising:
   a variable attenuator for varying the input level of the pumping light applied to the optical amplifier to thereby tune the amplification characteristic of the optical amplifier; and
   an optical coupler/splitter unit supplying the pumping light by coupling pumping light beams generated by multiple pumping light sources into one beam and then splitting the one beam into a plurality of beams,
      wherein the multiple pumping light sources, the optical coupler/splitter means and the variable attenuator are assembled into a unit.

6. The optical amplifier according to claim 3, wherein the optical coupler means is arranged such that pumping light from a separate pumping light source or a separate unit can be additionally coupled thereto.

7. The optical amplifier according to claim 5, wherein the optical coupler/splitter means is arranged such that pumping light from a separate pumping light source or a separate unit can be additionally coupled thereto.

8. An optical amplification unit comprising:
   an amplification medium for amplifying incoming signal light in response to application thereto of pumping light from a separate pumping light source unit,
   a connector to connect the optical amplification unit and the pumping light source unit to form an optical amplifier, and to disconnect the optical amplification unit and the pumping light source unit, and
   a variable attenuator that adjusts the level of pumping light input to the amplification medium.

9. A pumping light source unit comprising:
   a pumping light source for generating pumping light to be output to a separate optical amplification unit,
   a connector to connect the pumping light source unit and the optical amplification unit to form an optical amplifier, and to disconnect the pumping light source unit and the optical amplification unit, and
   a variable attenuator that adjusts the level of pumping light to be output to the optical amplification unit is provided.

10. An apparatus, comprising:
   a plurality of pumping light sources that output a plurality of pumping light beams;
   an optical coupler connected to the plurality of pumping light sources to couple the plurality of pumping light beams and output a single light beam, the single light beam being supplied to an optical amplifier; and
   a variable attenuator that varies an input level of the single light beam to thereby tune the amplification characteristic of the optical amplifier,
      wherein the plurality of pumping light sources and the optical coupler are assembled into a unit, the unit being arranged such that pumping light from one or more additional pumping light sources can be additionally coupled by the optical coupler.

11. An apparatus comprising:
   a pumping light source that outputs a pumping light beam;
   an optical splitter unit that splits the pumping light beam into a plurality of pumping light beams, each pumping light beam being supplied to an optical amplifier; and
   a plurality of variable attenuators positioned adjacent an output side of the optical splitter for receiving the plurality of pumping light beams, each of the plurality of variable attenuators receiving a respective one of the plurality of pumping light beams and varying the level of the pumping light beam to thereby tune the amplification characteristic of the optical amplifier to which the pumping light beam is supplied,
      wherein the pumping light source, the optical splitter unit and the plurality of variable attenuators are assembled into a unit.

12. An apparatus, comprising:
   two or more pumping light sources that generate respective pumping light beams;
   an optical splitter/coupler that couples the pumping light beams generated by the two or more pumping light sources into one beam and then splits the one beam into a plurality of pumping light beams, each of which is supplied to an optical amplifier; and
   a plurality of variable attenuators that receive the plurality of pumping light beams output by the optical splitter/coupler, each of the plurality of variable attenuators receiving a respective one of the plurality of pumping light beams and varying the level of the pumping light beam to thereby tune the amplification characteristic of the optical amplifier to which the pumping light beam is applied,
      wherein the two or more pumping light sources and the optical coupler/splitter are assembled into a unit, the unit being arranged such that pumping light beam from one or more additional pumping light sources can be additionally coupled by the optical coupler/splitter.

13. An optical amplification unit according to claim 8, wherein the variable attenuator is positioned within the optical amplification unit.

14. A pumping light source unit according to claim 9, wherein the variable attenuator is positioned within the pumping light source.

15. A wavelength division multiplexed (WDM) optical communication system comprising:
   a WDM communication medium for transmitting a WDM signal;
   a pumping light source unit, the pumping light source unit further comprising at least one pumping light source that outputs one or more pumping light beams:
   an optical amplification device, the optical amplification device further comprising at least one optical amplification unit, each of the optical amplification units further comprising; a coupler to couple an incoming WDM signal and the pumping, light beam; and an optical amplification medium through which the coupled WDM signal and pumping light beam are transmitted: and
   at least one variable attenuator that varies an input level of the pumping light beam applied to the optical amplification unit to thereby tune the amplification characteristic of the optical amplification unit, the at least one variable attenuator being positioned within the pumping light source or the optical amplification device; wherein
   the pumping light source and optical amplification device are positioned relative to each other such that heat generated in the pumping light source does not affect operational stability of the optical amplification device.

16. An optical amplifier for an optical communication system comprising:

a pumping light source unit, the pumping light source unit further comprising at least one pumping light source that outputs one or more pumping light beams;

an optical amplification device, the optical amplification device further comprising at least one optical amplification unit, each of the optical amplification units further comprising; a coupler to couple an incoming optical signal and the pumping light beam; and an optical amplification medium through which the coupled input optical signal and pumping light beam are transmitted; and at least one variable attenuator that varies an input level of the pumping light beam applied to the optical amplification unit to thereby tune the amplification characteristic of the optical amplification unit, the at least one variable attenuator being positioned within the pumping light source or the optical amplification device; wherein the pumping light source and optical amplification device are positioned relative to each other such that heat generated in the pumping light source does not affect operational stability of the optical amplification device.

17. An apparatus, comprising:

a plurality of pumping light sources that output a plurality of pumping light beams;

an optical coupler connected to the plurality of pumping light sources to couplet the plurality of pumping light beams and output a single light beam, the single light beam bing supplied to an optical amplifier; and a variable attenuator that varies an input level of the single light beam to thereby tune the amplification characteristic of the optical amplifier, wherein the plurality of pumping light sources, the optical coupler and the variable attenuator are assembled into a unit.

18. The apparatus according to claim 17, wherein the optical coupler is arranged such that pumping light from one or more additional pumping light sources can be additionally coupled by the optical coupler.

19. An apparatus, comprising:

two or more pumping light sources that generate respective pumping light beams;

an optical coupler/splitter that couples the pumping light beams generated by the two or more pumping light sources into one beam and then splits the one beam into a plurality of pumping light beams, each of which is supplied to an optical amplifier; and a plurality of variable attenuators that receive the plurality of pumping light beams output by the optical coupler/splitter, each of the plurality of variable attenuators receiving a respective one of the plurality of pumping light beams and varying the level of the pumping light beam to thereby tune the amplification characteristic of the optical amplifier to which the pumping light beam is applied, wherein the two or more pumping light sources, the optical coupler/splitter and the plurality of variable attenuators are assembled into a unit.

20. An apparatus according to claim 19, wherein the optical coupler/splitter is arranged such the pumping light from one or more additional pumping light sources can be additionally coupled by the optical coupler/splitter.

* * * * *